(12) United States Patent
Nagasawa et al.

(10) Patent No.: US 7,408,388 B2
(45) Date of Patent: Aug. 5, 2008

(54) SWITCHING POWER SUPPLY DEVICE, SEMICONDUCTOR INTEGRATED CIRCUIT DEVICE AND POWER SUPPLY DEVICE

(75) Inventors: Toshio Nagasawa, Tokyo (JP); Ryotaro Kudo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 35 days.

(21) Appl. No.: 11/586,548

(22) Filed: Oct. 26, 2006

(65) Prior Publication Data

US 2007/0103005 A1 May 10, 2007

(30) Foreign Application Priority Data

| Nov. 8, 2005 | (JP) | ............................. 2005-323832 |
| Jan. 13, 2006 | (JP) | ............................. 2006-005512 |
| Aug. 28, 2006 | (JP) | ............................. 2006-231129 |

(51) Int. Cl.
*H03K 3/00* (2006.01)
(52) U.S. Cl. .................... 327/110; 327/111; 323/282
(58) Field of Classification Search ................. 327/108, 327/110–112; 323/282
See application file for complete search history.

(56) References Cited

U.S. PATENT DOCUMENTS

| 5,544,032 A | * | 8/1996 | Mimura ........................ 363/16 |
| 6,064,580 A | * | 5/2000 | Watanabe et al. .............. 363/17 |
| 6,559,684 B2 | | 5/2003 | Goodfellow et al. |
| 6,979,985 B2 | * | 12/2005 | Yoshida et al. ............... 323/282 |
| 7,126,388 B2 | * | 10/2006 | Harriman ..................... 327/108 |
| 7,138,786 B2 | * | 11/2006 | Ishigaki et al. ............... 323/224 |

* cited by examiner

*Primary Examiner*—N. Drew Richards
*Assistant Examiner*—Hai L. Nguyen
(74) *Attorney, Agent, or Firm*—Mattingly, Stanger, Malur & Brundidge, PC

(57) ABSTRACT

There are provided a switching power supply device performing a stable operation with fast response, a semiconductor integrated circuit device, and a power supply device.

A capacitor is provided between the output side of an inductor and a ground potential. A first power MOSFET supplies an electric current from an input voltage to the input side of the inductor. A second power MOSFET turned on when the first power MOSFET is off allows the input side of the inductor to be of a predetermined potential. A first feedback signal corresponding to an output voltage obtained from the output side of the inductor and a second feedback signal corresponding to an electric current flowed to the first power MOSFET are used to form a PWM signal. The first power MOSFET has plural cells of a vertical type MOS-construction. The number of cells is 1/N. A detection MOSFET in which the gains and the drains are shared over the same semiconductor substrate with the first power MOSFET is provided to form a second feedback signal.

13 Claims, 23 Drawing Sheets

VOLTAGE CONTROL SYSTEM

PEAK CURRENT CONTROL SYSTEM

US 7,408,388 B2

SWITCHING POWER SUPPLY DEVICE, SEMICONDUCTOR INTEGRATED CIRCUIT DEVICE AND POWER SUPPLY DEVICE

CROSS-REFERENCE TO RELATED APPLICATION

The present application claims priority from Japanese patent application No. 2006-231129 filed on Aug. 28, 2006, No. 2005-323832 filed on Nov. 8, 2005 and No. 2006-5512, filed on Jan. 13, 2006, the contents of which are hereby incorporated by reference into this application.

BACKGROUND OF THE INVENTION

The present invention relates to a switching power supply device, a semiconductor integrated circuit device, and a power supply device. For instance, the present invention relates to a technique effective to be applied to a switching power supply device converting a high voltage to a low voltage and a semiconductor integrated circuit device used therefor.

There is U.S. Pat. No. 6,559,684 as a switching power supply device. There is "Fundamentals of Power Electronics Second Edition", pp. 439-449, published by KLUWER ACADEMIC PUBLISHERS in the United States, as a technical document related to a switching power supply device.
[Patent Document 1] U.S. Pat. No. 6,559,684
[Non-Patent Document 1] "Fundamentals of Power Electronics Second Edition", pp. 439-449, published by KLUWER ACADEMIC PUBLISHERS

SUMMARY OF THE INVENTION

The operating frequency of a recent PC (personal computer) and a system control unit (memory, CPU, and GPU) mounted on a server is being faster year by year for increasing processing capacity. A supply voltage thereof is being lowered. Both electric current consumption increased by high-frequency operation and a leak current caused due to lowered voltage tend to increase. A power supply circuit is required to provide increased accuracy of a supply voltage, fast response for preventing lowered supply voltage at sudden change in load, and stabile operation. The design of the power supply circuit becomes very difficult in order to meet these requirements.

FIG. 10 shows the schematic construction of a voltage drop type switching power supply device of a power supply control system which has been studied prior to this invention. FIG. 11 shows an operating waveform diagram thereof. In the voltage control system, there is one feedback loop FB since only output voltage Vout is monitored via feedback circuit CPS. The circuit design is easy. Since error amplifier EA compares RAMP waveforms at high amplitude level, a satisfactory noise margin can be obtained. It is difficult to stabilize the feedback loop system. Fast response is impossible since the loop gain need be dropped.

FIG. 12 shows a schematic block diagram of a peak current control system which has been studied prior to this invention. FIG. 13 shows an operating waveform diagram thereof. In the peak current control system, output voltage Vout and input current IL/N are monitored and there are two feedback loops FB1 and FB2. The instable element of the feedback loop system can be cancelled. The phase compensation becomes easy. The loop gain need not be dropped excessively. The switching power supply device of the peak current control system is a circuit suitable for fast load response of a power supply. High accuracy current detection is necessary for monitoring the input current. The circuit construction of the peak current control system is more complicated than that of the voltage control system. Output current IL is detected from the switch node of the power supply circuit. Unnecessary current information such as spike noise need be cancelled.

FIG. 14 shows a block diagram of a switching power supply device of the peak current control system which has been studied prior to this invention. MOSFETQS (hereinafter, called a sense MOSFET) having an area which is 1/N of that of high side power MOSFETQM. An electric current which is 1/N times an electric current flowed to the main MOSFETQM is flowed to the sense MOSFETQS. For instance, when the ratio between the main MOSFETQM and the sense MOSFETQS is 5000:1, the sense current is 5 mA when the main current is 25 A. This is sensed by end-to-end voltage Vs of sense resistance Rs. In this case, in the Non-Patent Document, an operational amplifier of the source input as shown in FIG. 15 is used so that the source potential of the sense MOSFET and the source of the main MOSFET are of the same potential, obtaining a high accuracy sense current.

Negative feedback control is performed by the operational amplifier as shown in FIG. 15 so that the source potentials of the main MOSFETQM and the sense MOSFETQS are equal in order to obtain the sense current, For high accuracy current detection, an offset of the operational amplifier need be minimum. Typically, to prevent manufacturing variation for fast operation, a CMOS process is used for MOSFETQ1 and MOSFETQ2 in differential parts. A high voltage (e.g., 0 to 16V) is applied between the drain and the source of MOSFETQ3 connected to an OUT terminal. An LD-MOSFET using a high voltage process is used for the MOSFETQ3. The MOSFETQ3 using the high voltage process has Vth higher than that of the CMOS process and varies the voltage between the gate and the source depending on a sense current value.

For the above offset, a systematic offset can be caused, as shown in FIG. 16. The operational amplifier has a low input impedance at the source terminal. When no bias current is supplied from the sense current, normal operation is impossible. The bias current causes a further offset. For instance, the bias current of the operational amplifier is 150 μA and the ratio between the main MOSFETQM and the sense MOSFETQS is 5000:1. When an electric current of 0 A is flowed to the main MOSFETQM, 150 μA as the bias current to the amplifier has already been flowed to the sense MOSETQS. An electric current of 150 μA×5000=750 mA is flowed to the main MOSFET. The amplifier can have an offset of 750 mA in a steady state.

The detection current is displaced in the amplifier by about 1 A, as shown in the characteristic diagram of FIG. 17, due to the systematic offset and the bias current offset. The amplifier cannot be used for peak current control which is required to increase the accuracy of an output current. At light load such as no load, main current IL is flowed backward to the power supply side and the sense current tends to be flowed backward. There is no supply source of the backflow current. In this period, the amplifier is inactive. Response at light load can be delayed.

As described above, both electric current consumption increased by high-frequency operation and a leak current caused due to lowered voltage tend to increase. A power supply circuit is required to provide increased accuracy of a supply voltage, fast response for preventing lowered supply voltage at sudden change in load, and stabile operation. The design of the power supply circuit which meets these requirements becomes very difficult. Plural power supply devices have been studied to be operated in parallel corresponding to a load current. Such power supply device need to have a new function intended for parallel operation.

An object of the present invention is to provide a switching power supply device performing stable operation with fast response and a semiconductor integrated circuit device preferable therefor. Another object of the present invention is to provide a power supply device preferable for parallel operation. A further object of the present invention is to provide a power supply device which can change and increase the current supply capability. A still further object of the present invention is to provide a power supply device which increases efficiency with fast response. The foregoing and other objects and novel features of the present invention will be apparent from the description of this specification and the accompanying drawings.

The overview of a representative invention disclosed in this application will be briefly described as follows. A capacitor is provided between the output side of an inductor formed with an output voltage and a ground potential. A first power MOSFET supplies an electric current from an input voltage to the input side of the inductor. A second power MOSFET turned on when the first power MOSFET is off allows the input side of the inductor to be of a predetermined potential. A control circuit uses a first feedback signal corresponding to an output voltage obtained from the output side of the inductor and a second feedback signal corresponding to an electric current flowed to the first power MOSFET to form a PWM signal. The first power MOSFET has plural cells of a vertical type MOS construction. A detection MOSFET in which the number of cells is 1/N of that of the first power MOSFET and the gate and the drain or the source are shared with the first power MOSFET over the same semiconductor substrate is provided to form the second feedback signal.

The overview of another representative invention disclosed in this application will be briefly described as follows. A periodic signal corresponding to an output signal of an oscillation circuit is transmitted to a pulse generation circuit via a first signal transmission path and is transmitted to a first external terminal via a second signal transmission path. A periodic signal inputted from the first external terminal is transmitted to the pulse generation circuit via a third signal transmission path. A PWM period of the switching power supply circuit is set by a timing signal formed by the pulse generation circuit. There are provided a first mode transmitting the periodic signal corresponding to the output signal of the oscillation circuit via the first signal transmission path and the second signal transmission path and a second mode transmitting the periodic signal inputted from the first external terminal via the third signal transmission path.

The overview of a further representative invention disclosed in this application will be briefly described as follows. A periodic signal corresponding to an output signal of an oscillation circuit is transmitted to a pulse generation circuit via a first signal transmission path in a first mode and is transmitted to a first external terminal via a second signal transmission path. The periodic signal inputted from the first external terminal is transmitted to the pulse generation circuit via a third signal transmission path in a second mode. The first external terminals of the first power supply device and the second power supply device to which a PWM period of the switching power supply circuit is set by a timing signal formed by the pulse generation circuit are connected. The first power supply device is operated in the first mode. The second power supply device is operated in the second mode.

The stable operation is possible with fast response of the switching power supply device.

Plural power supply devices can be easily operated in parallel. The parallel operation can change and increase the current supply capability. Noise reduction is easy. Fast response and increased efficiency are possible.

DETAILED DESCRIPTION OF THE PREFERRED EMBODIMENTS

Figure 1:
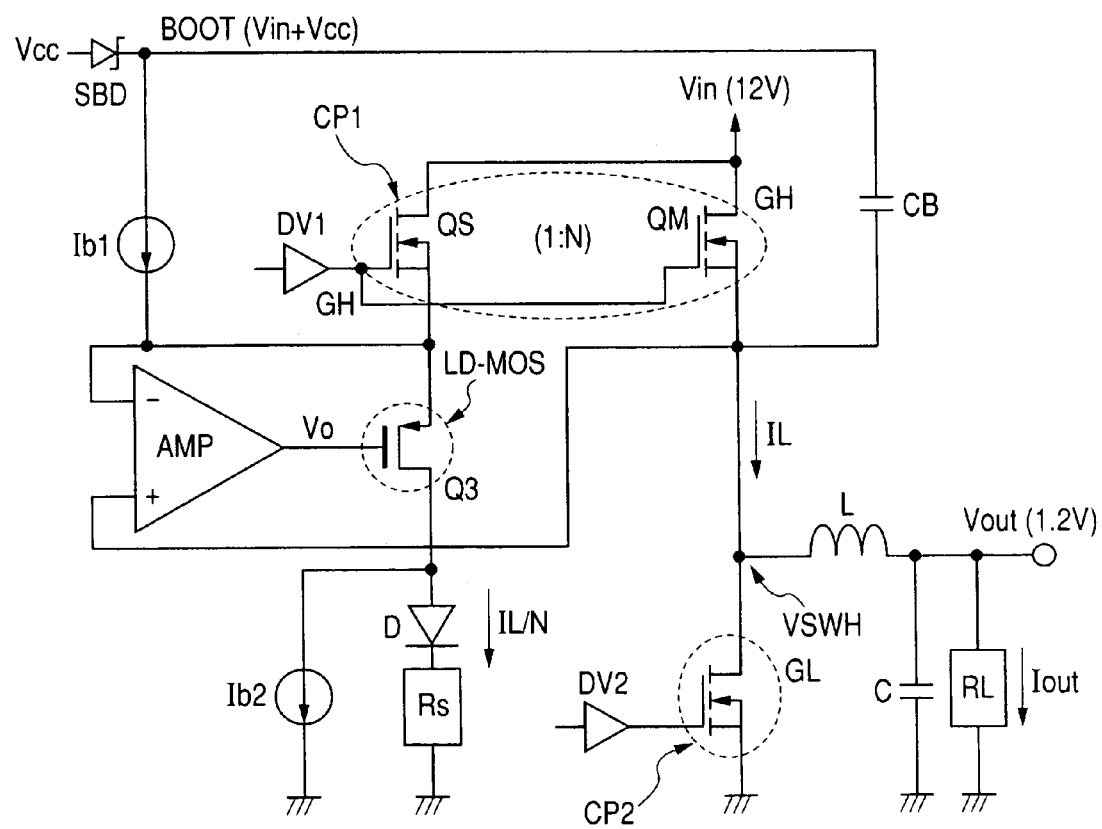
FIG. 1 is an essential part schematic circuit diagram showing an embodiment of a switching power supply device according to this invention.

FIG. 1 shows an essential part schematic circuit diagram of an embodiment of a switching power supply device according to this invention. This embodiment is intended for a voltage drop type switching power supply device which forms output voltage Vout obtained by dropping input voltage Vin. Without being particularly limited, the input voltage Vin is a relatively high voltage of e.g., 7 to 16V, and the output voltage Vout is a low voltage of about 1.2V. The drawing shows an example in which the input voltage Vin is 12V.

The input voltage Vin supplies electric current IL from the input side of inductor L via high potential side switch MOSFETGH. Capacitor C is provided between the output side of the inductor L and circuit ground potential GND. Such capacitor C smoothens the input voltage Vin to form the output voltage Vout. The output voltage Vout is an operating voltage of load circuit RL such as a microprocessor CPU. Switch MOSFETGL is provided between the input side of the inductor L and the circuit ground potential GND. The MOSFETGL is turned on when the high potential side switch MOSFETGH is off to allow midpoint voltage VSWH to be of the circuit ground potential, clamping a counter electromotive voltage caused in the inductor L. Without being particularly limited, the switch MOSFETGH and MOSFETGL are constructed by vertical type power MOSFETs of N channel type. As described above, the junction of the switch MOSFETGH and MOSFETGL is connected to the input side of the inductor L.

In this embodiment, the high potential side switch MOSFETGH has MOSFETQM and MOSFETQS. The MOSFETQM and MOSFETQS are formed over one semiconductor chip CP1. The MOSFETQM is a main MOSFET forming the electric current IL as the high potential side switch MOSFETGH. The MOSFETQS is a sense MOSFET monitoring the electric current IL flowed to the MOSFETQM. As described later, these are vertical type MOSFETs formed over one semiconductor substrate. These are formed to have an area ratio of N:1 (e.g., 5000:1). The MOSFETQS flows an electric current of IL/N (IL/5000). The low potential side switch MOSFETGL is formed by one semiconductor chip CP2.

The drains and the gates of the MOSFETQM and MOSFETQS are integrally formed over the semiconductor substrate and have the same voltage. The MOSFETQM and MOSFETQS are operated as source follower output MOSFETs. To obtain the electric current IL/N corresponding to the area ratio, the source potentials of both the MOSFETQM and the MOSFETQS need be equal. The source potentials of both the MOSFETQM and the MOSFETQS are supplied to the positive phase input (+) and the negative phase input (−) of differential amplification circuit AMP, respectively. Output voltage Vo of the differential amplification circuit AMP is supplied to the gate of P channel MOSFETQ3. The source of the MOSFETQ3 is connected to the source of the MOSFETQS. Without being particularly limited, the drain of the MOSFETQ3 is provided with diode D and resistance Rs. The resistance Rs forms a voltage signal corresponding to the sense current IL/N of the MOSFETQS which is one feedback loop signal for forming a PWM signal.

Without being particularly limited, in this embodiment, the source side and the drain side of the MOSFETQ3 are provided with bias current sources Ib1 and Ib2. The bias current sources Ib1 and Ib2 are not particularly limited and are constructed by current mirror MOSFETs operated by a shared current to flow the same bias current. The MOSFETQ3 is provided with such bias current sources Ib1 and Ib2. Even at no load in which the sense current is almost zero, the drain voltages of the main MOSFETQM and the sense MOSFETQS are normally equal to flow the sense current at high accuracy. While maintaining such state, an offset caused due to the flow of the bias current flowed to the MOSFETQ3 into the resistance Rs can be prevented.

Figure 12:
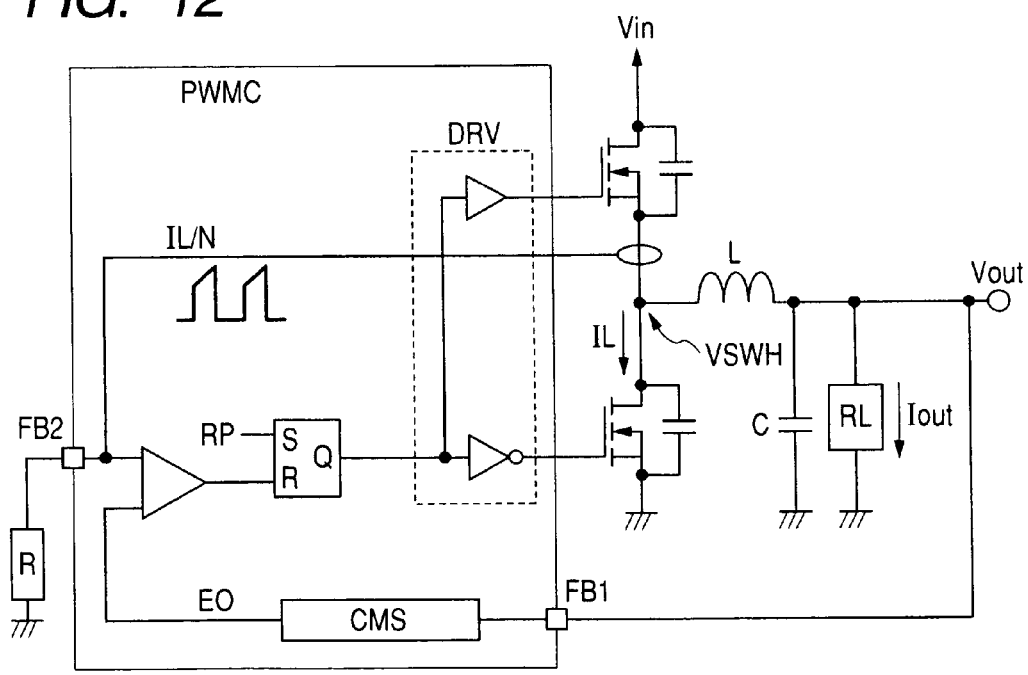
FIG. 12 is, a schematic block diagram of a switching power supply device of a peak current control system which has been studied prior to this invention.
Figure 13:
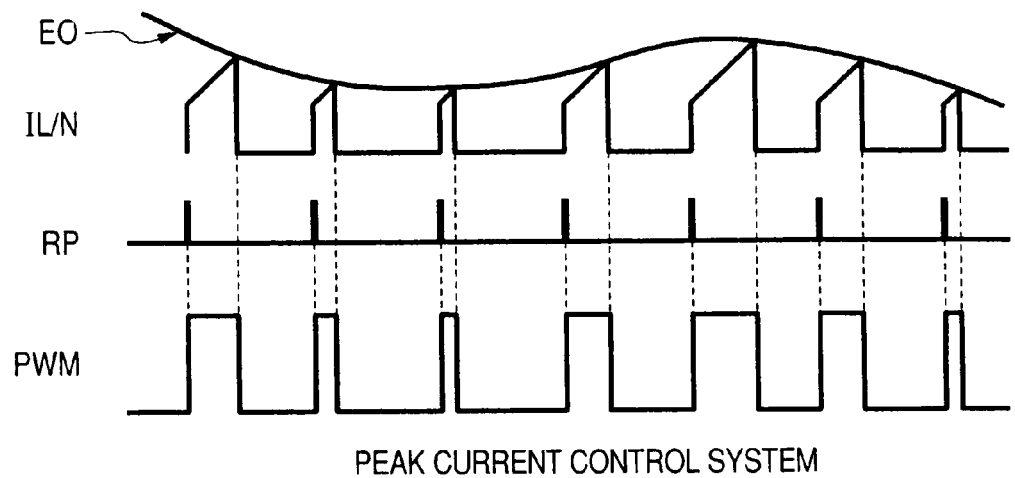
FIG. 13 is an operating waveform diagram of the switching power supply device of FIG. 12.
Figure 14:
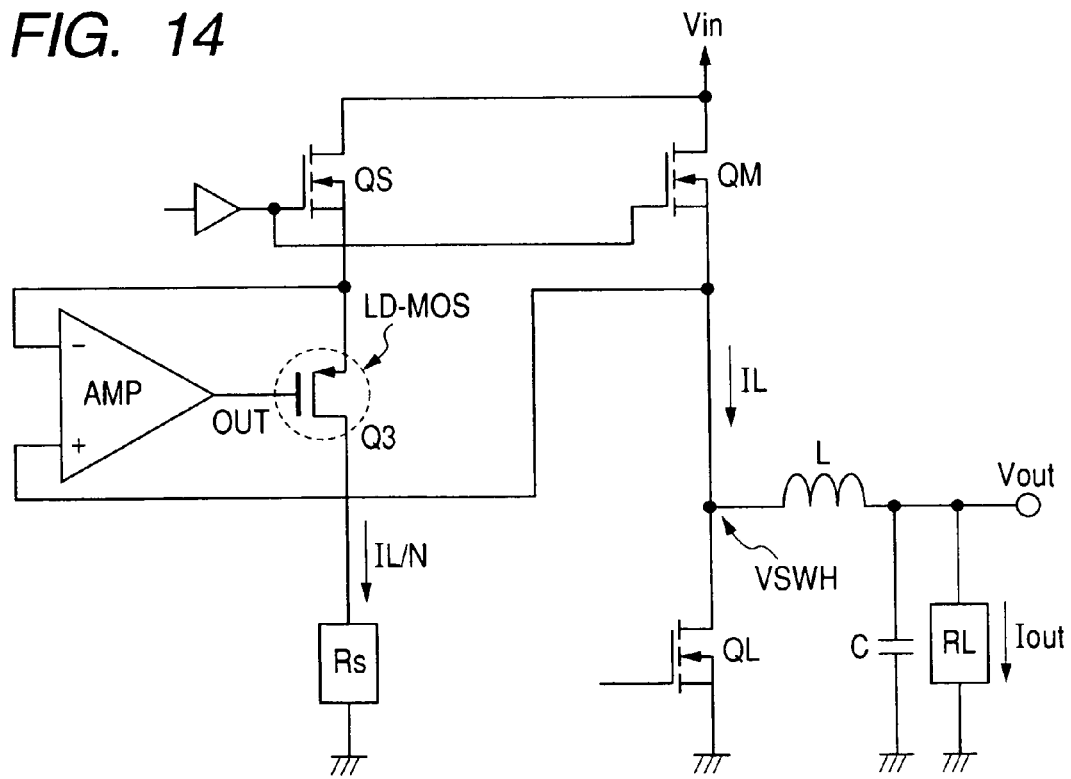
FIG. 14 is a block diagram of a switching power supply device of a peak current control system which has been studied prior to this invention.
Figure 15:
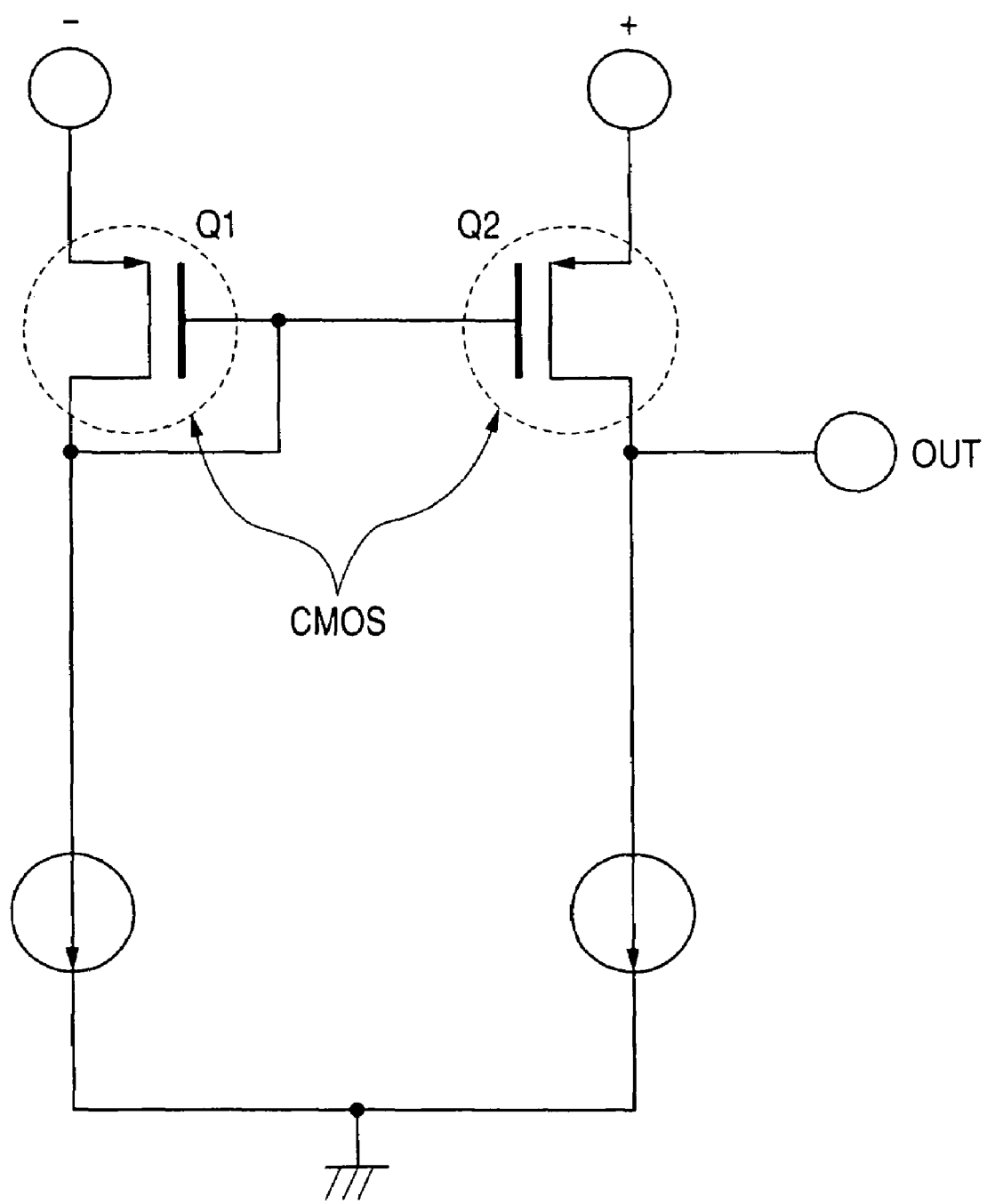
FIG. 15 is a circuit diagram showing an embodiment of an operational amplifier of FIG. 15.
Figure 16:
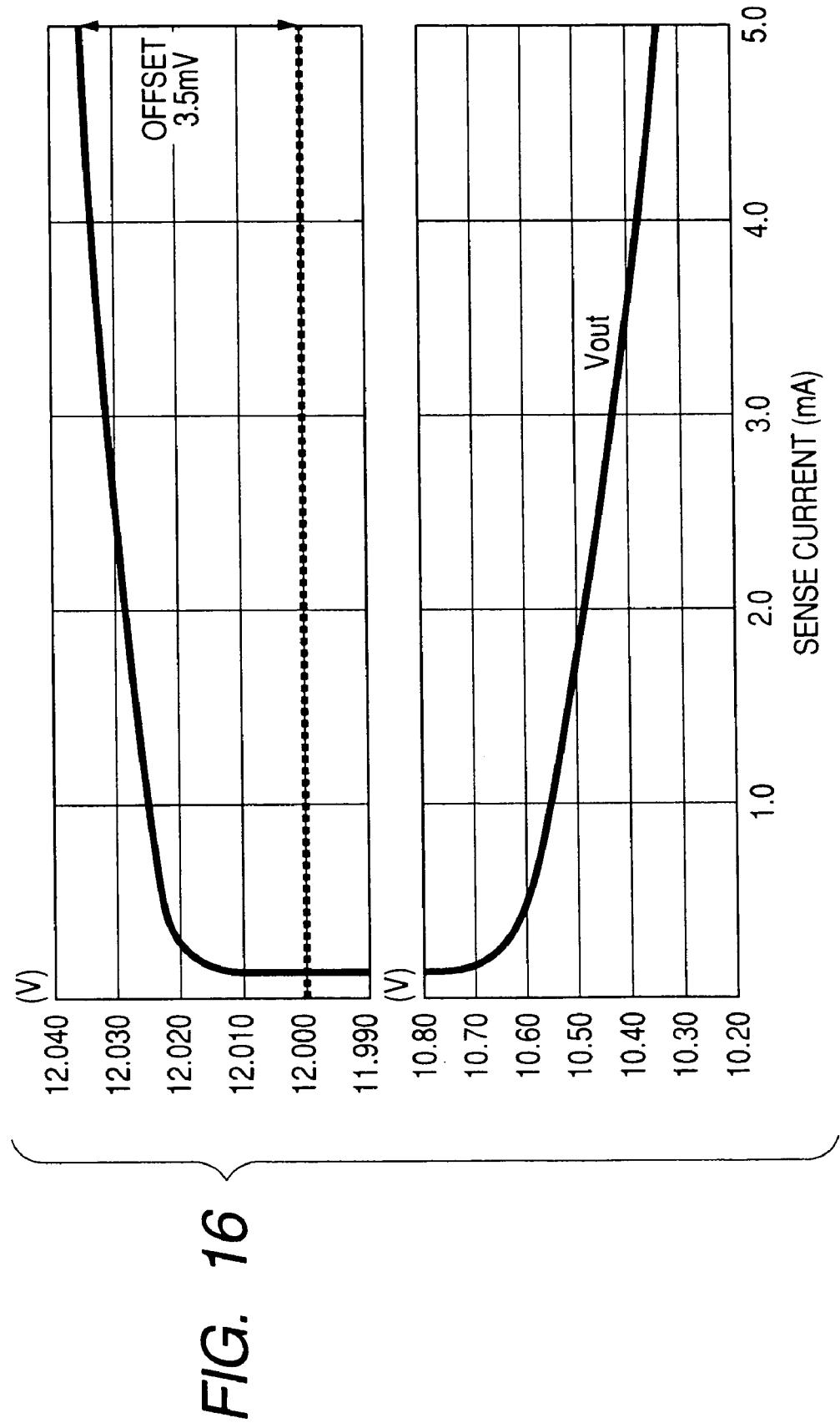
FIG. 16 is a characteristic diagram of an offset voltage and output voltage Vo to a sense current, of assistance in explaining the operation of the operational amplifier of FIG. 15.
Figure 17:
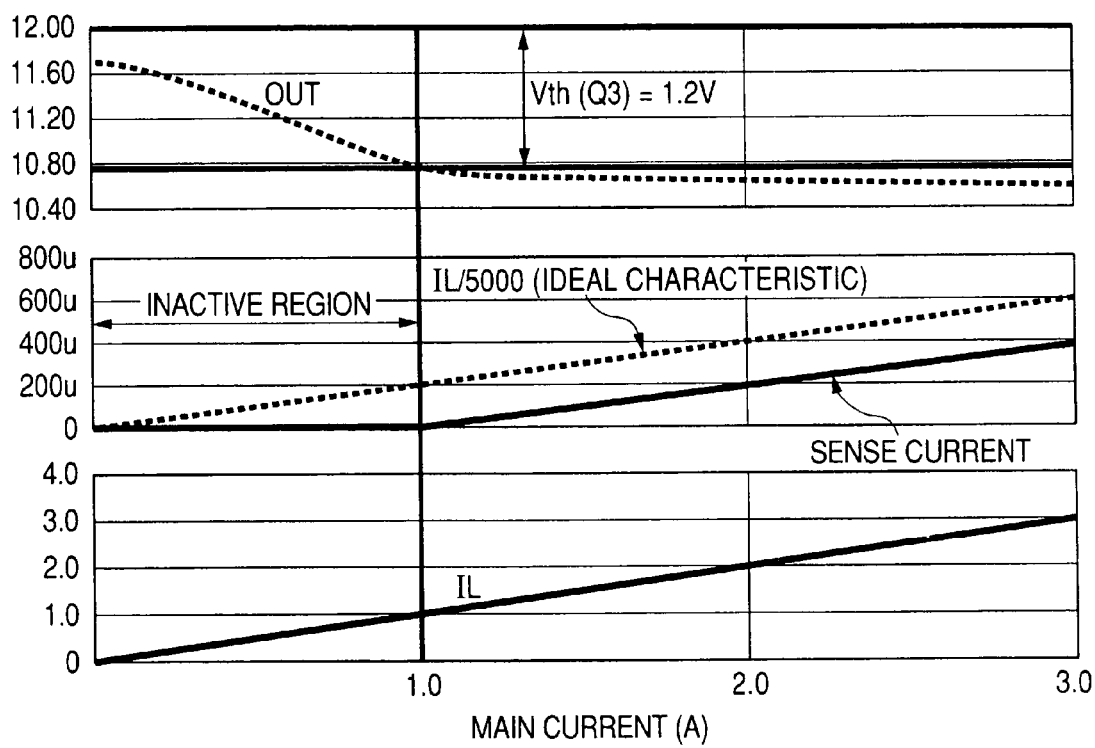
FIG. 17 is a characteristic diagram of a sense current and an output voltage to a main current when using an operational amplifier of FIG. 15.

Although being omitted in the drawing, the peak current control system using two feedback loops FB1 and FB2 as shown in FIG. 12 is applied. A PWM generation circuit of such peak current control system forms the PWM signal controlling the output voltage Vout to a voltage of about 1.2V. The resistance Rs forms the PWM signal by a comparison signal of the peak value (FB2) of the voltage IL/N corresponding to the sense current as shown in FIG. 13 and voltage signal EO (FB1) obtained by dividing the output voltage Vout by a voltage divider circuit, not shown, inputting the divided voltage to compensation circuit CMS, and removing any high-frequency component as an output of the compensation circuit CMS. The PWM signal is inputted to a control circuit. Such control circuit performs switch control of the switch MOSFETGH and MOSFETGL via driver DV1 and DV2.

In this embodiment, N channel type power MOSFETGH (QM) of low ON-state resistance and low Qgd is used as the high potential side switch device to be operated as a source follower output circuit. To obtain high voltage BOOT in the midpoint potential corresponding to the input voltage Vin, in other words, to prevent loss due to the midpoint potential VSWH lowered by the threshold voltage of the MOSFETGH (QM), a boosting circuit is provided.

The boosting circuit operates to allow the gate voltage when the MOSFETGH is on to be a high voltage above the threshold voltage with respect to the input voltage Vin. The midpoint is connected to one end of boot strap capacitance CB as shown. The other end of the boot strap capacitance CB is connected to power terminal Vcc of 5V via a switch device such as Schottky diode SBD. When the low potential side switch MOSFETGL is on and the high potential side switch MOSFETGH is off, the boot strap capacitance CB is charged-up from the power terminal Vcc. When the MOSFETGL is turned off and the MOSFETGH (QM) is switched on, the gate voltage is boosted with respect to the source side potential of the MOSFETGH by the charge-up voltage (Vin+Vcc) of the boot strap capacitance CB. In this example, voltage loss by the Schottky diode SBD is neglected. The boosted voltage BOOT is used as an operating voltage of the driver DV1, the bias current source Ib1, and the differential amplification circuit AMP.

Figure 2:
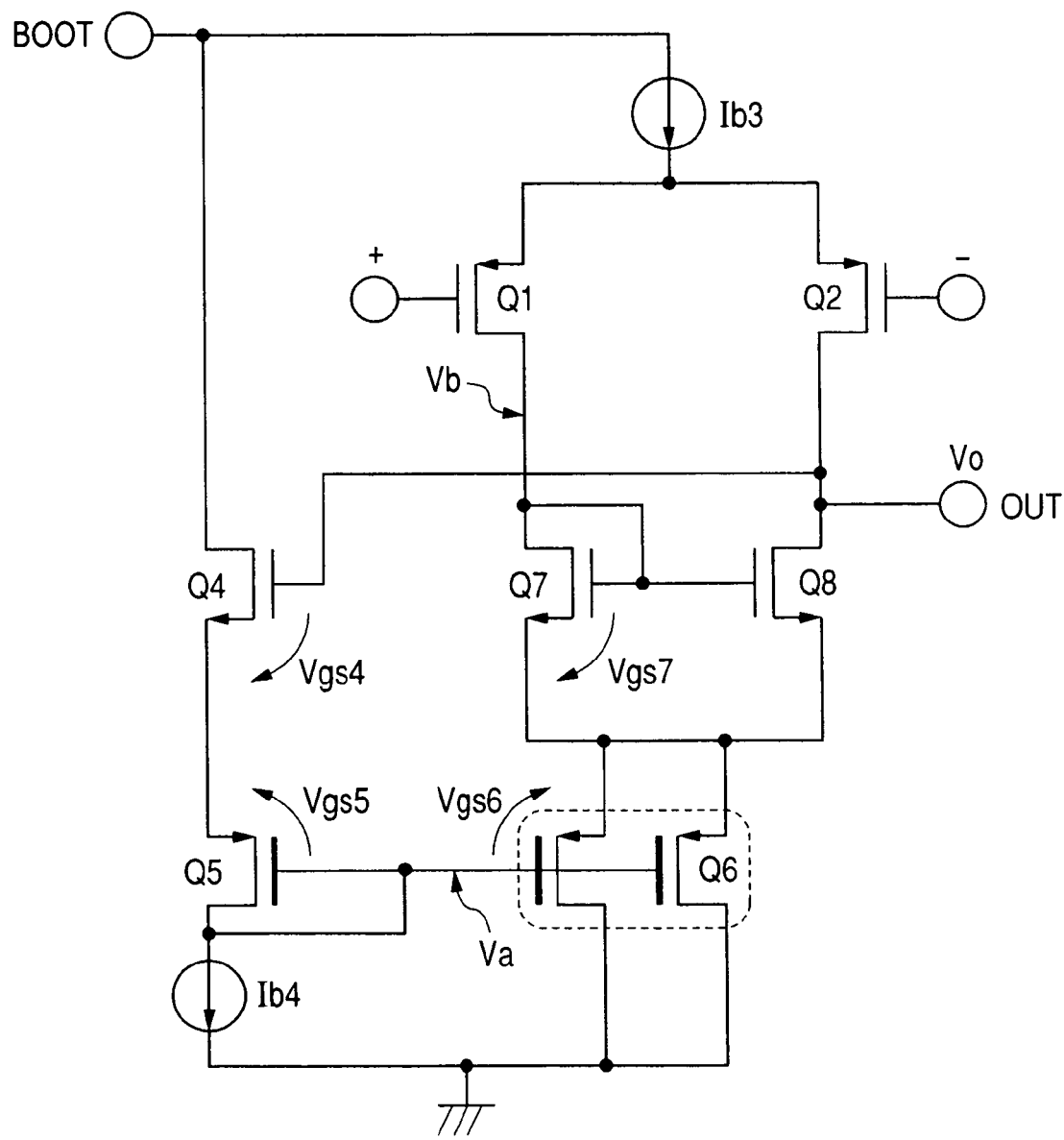
FIG. 2 is a circuit diagram showing an embodiment of a differential amplification circuit of FIG. 1.

FIG. 2 shows a circuit diagram of an embodiment of the differential amplification circuit of FIG. 1. P channel MOSFETQ1 and MOSFETQ2 are connected in a differential form. Bias current source Ib3 is provided between the sources of the MOSFETQ1 and the MOSFETQ2 and the boosted voltage BOOT. The gate of the MOSFETQ1 is connected to the positive phase input terminal (+). The gate of the MOSFETQ2 is connected to the negative phase input terminal (−). N channel MOSFETQ7 and MOSFETQ8 in a current mirror form are provided as load circuits in the drains of the MOSFETQ1 and the MOSFETQ2. The gate and the drain of the MOSFETQ7 are connected in a diode form. The gate and the drain of the MOSFETQ7 are connected to the drain of the MOSFETQ1. The gate and the source of the MOSFETQ8 are sharably connected to the gate and the source of the MOSFETQ7 in the current mirror form. The drain of the MOSFETQ8 and the drain of the MOSFETQ2 are connected to output terminal OUT to form the output voltage Vo.

In this embodiment, the output voltage Vo is connected to the gate of N channel MOSFETQ4. Without being particularly limited, the boosted voltage BOOT is supplied to the drain of the MOSFETQ4. The source of the MOSFETQ4 is connected to the source of P channel MOSFETQ5. The drain and the gate of the MOSFETQ5 are sharably connected in a diode form. Bias current source Ib4 is provided between the drain and the gate of the MOSFETQ5 and ground potential VSS. P channel MOSFETQ6 connected in a source follower form is provided between the sharably connected sources of the MOSFETQ7 and the MOSFETQ8 and the circuit ground potential VSS.

The MOSFETQ1, MOSFETQ2, MOSFETQ7, and MOSFETQ8 construct the differential amplification circuit of a general gate input. The MOSFETQ4, MOSFETQ5, and MOSFETQ6 construct a systematic offset cancel circuit. When the gate voltage of the MOSFETQ5 is Va and the drain voltage of the MOSFETQ7 is Vb, the following equation is established.

$$Va = Vout - Vgs4 - Vgs5 \quad (1)$$

$$Vb = Va + Vgs7 + Vgs6 \quad (2)$$

When Ib4=Ib3/2, Vgs4=Vgs7 and Vgs5=Vgs6. Vo=Vb by the above equations (1) and (2). The Vgs4 to Vgs7 are the gate and source voltages of the MOSFETQ4 to MOSFETQ7.

The output voltage Vo of the differential amplification circuit is connected to the gate of MOSFETQ13, as shown in FIG. 1. The positive phase input (+) and the negative phase input (−) of the differential amplification circuit AMP are connected to the sources of the main MOSFETQ10 and the sense MOSFETQ11. The drain voltages of the differential MOSFETQ1 and MOSFETQ2 in the differential amplification circuit AMP are equal like Vo=Vb. This means that the positive phase input (+) and the negative phase input (−) are equal so that the condition of Ib4=Ib3/2 is established. Increase and decrease in the sense current (IL/N) and Vth influence of the LD-MOSFETQ13 are eliminated. The systematic offset is cancelled. The offset voltage is small like 5.3 µV (microvolt) at most and the accuracy of the differential amplification circuit AMP can be increased.

In this embodiment, the offset voltage can be smaller to 5.3 µV at most so as to be neglected irrespective of increase and decrease in the sense current IL, as described above. The main current flowed to the main MOSFETQ10 can produce the output voltage Vo of the differential amplification circuit AMP from near zero ampere. Such output voltage Vo is lowered so as to compensate for increase in gate and source voltage Vgs of the MOSFETQ13 corresponding to increase in the main current IL. As described above, the source potentials of the main MOSFETQ10 and the sense MOSFETQ11 are equal to realize PWM control by the peak current control system at high accuracy.

Figure 3:
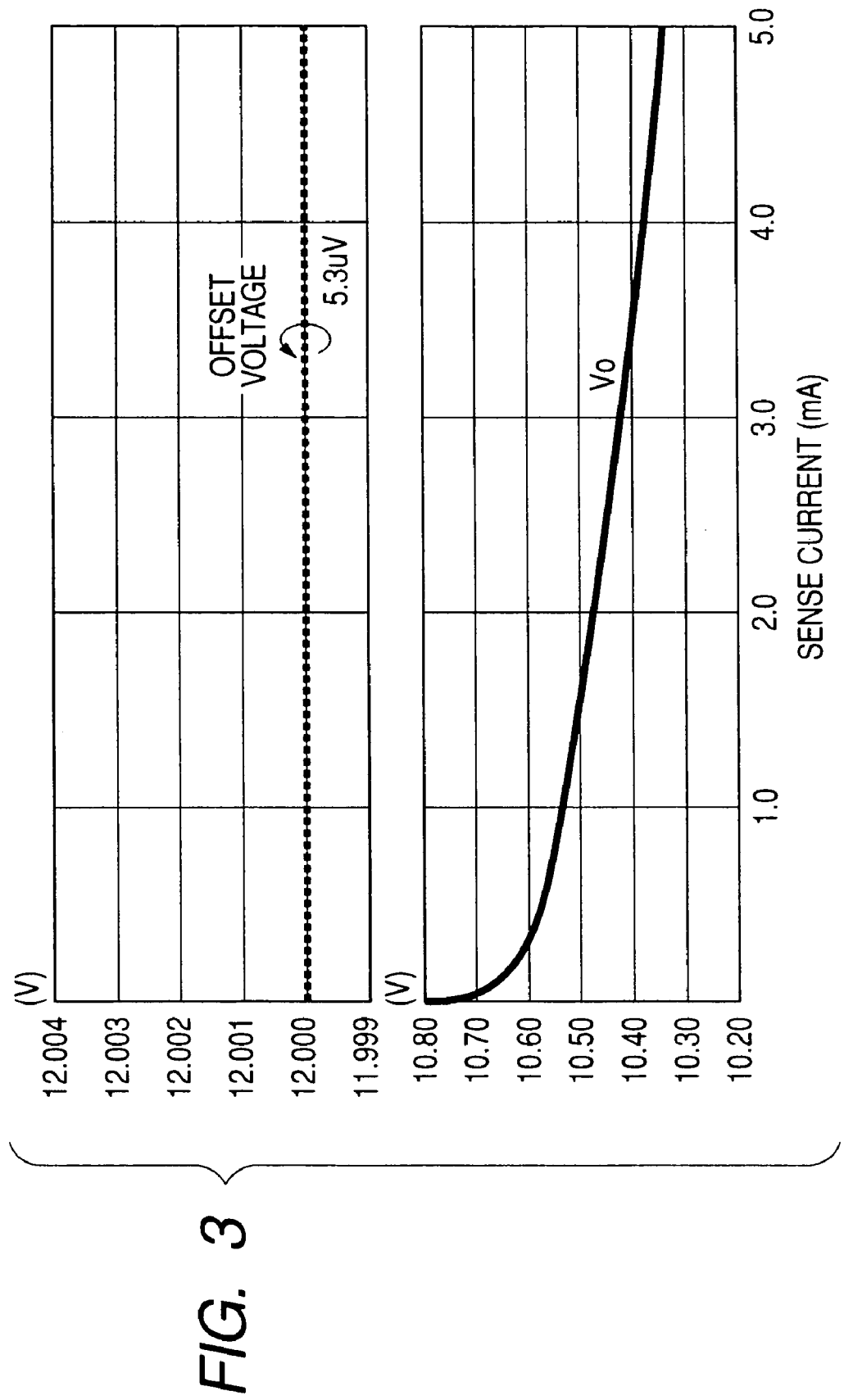
FIG. 3 is a characteristic diagram of an offset voltage and output voltage Vo to a sense current, of assistance in explaining the operation of the differential amplification circuit of FIG. 2.

As shown in FIG. 3, the offset voltage can be smaller to 5.3 µV at most so as to be neglected irrespective of increase and decrease in the sense current IL. The main current flowed to the main MOSFETQM can produce output voltage Vo of the differential amplification circuit AMP from near zero ampere. Such output voltage Vo is lowered so as to compensate for increase in the threshold voltage Vgs of MOSFETQ3 corresponding to increase in the main current IL. As described above, the source potentials of the main MOSFETQM and the sense MOSFETQS are equal to realize PWM control by the peak current control system at high accuracy.

Figure 4:
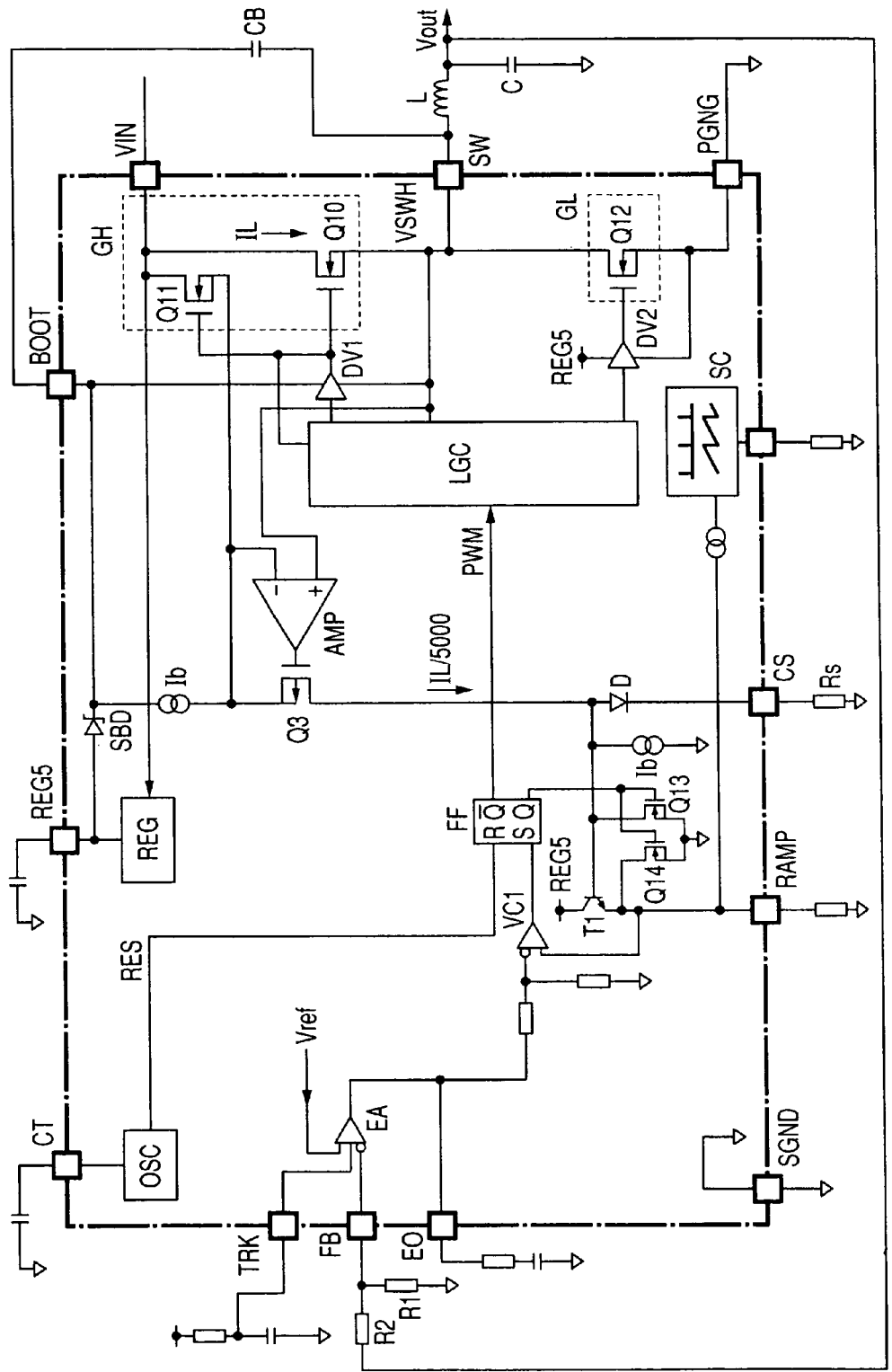
FIG. 4 is an overall block diagram showing an embodiment of the switching power supply device according to this invention.

FIG. 4 shows an overall block diagram of an embodiment of the switching power supply device according to this invention. Without being particularly limited, the part surrounded by the dash-single-dot line in the drawing indicates a semiconductor integrated circuit device of a multi-chip construction. Three semiconductor chips having two power MOSFETs and a control circuit thereof as indicated by the dotted lines are mounted over one package. The high potential side switch MOSFETGH has the MOSFETQ10 corresponding to the main MOSFETQM and the MOSFETQ11 corresponding to the sense MOSFETQS. The area ratio (current ratio) between the MOSFETQ10 and MOSFETQ11 is set to 5000:1. The low potential side switch MOSFETGL has MOSFETQ12. The source of the MOSFETQ12 is connected to independent ground terminal PGND to reduce the influence of switching noise.

An input voltage of about 12V is supplied from terminal VIN. The voltage of the terminal VIN is connected to the drains of the MOSFETQ10 and the MOSFETQ11 and is connected to power supply circuit REG. The power supply circuit REG receives the input voltage VIN of 12V to form an internal voltage of about 5V. Terminal REG5 is connected to the stabilizing capacitor. An internal voltage corresponding to the supply voltage Vcc is formed. The internal voltage formed by the power supply circuit REG is an operating voltage of logic circuit LGC receiving the PWM signal to form a switch control signal of the high potential side switch MOSFETGH and the low potential side switch MOSFETGL, the driver DV2 forming a driving signal supplied to the gate of the low potential side switch MOSFETQ12, and an internal circuit such as transistor T1 of the later-described slope compensation circuit.

The internal voltage formed by the power supply circuit REG is connected to one end of the boot strap capacitance CB via the Schottky diode SBD and the terminal BOOT constructing the boosting circuit. The other end of the boot strap capacitance CB is connected to terminal SW. The terminal SW is connected to the source of the MOSFETQ10 and the drain of the MOSFETQ12 and is connected to the input side of the inductor L. The capacitor C is provided between the other end of the inductor L and the circuit ground potential. The output voltage Vout of 1.2V is formed to be supplied to a load circuit, not shown.

The source of the MOSFETQ11 and the source of the MOSFETQ10 are connected to input terminals (+) and (−) of the differential amplification circuit AMP. The differential amplification circuit AMP is constructed by a circuit as shown in FIG. 2. The source potentials of the MOSFETQ10 and the MOSFETQ11 are equal for operation to obtain a high accuracy sense current. MOSFETQ3 to which the sense current formed by the MOSFETQ11 is flowed has a high voltage device like the LD-MOSFET. The source side and the drain side of such MOSFETQ3 are provided with bias current source Ib corresponding to the bias current sources Ib1 and Ib2 shown in FIG. 2. The drain of the MOSFETQ3 is connected to terminal CS via the diode D. The terminal CS is connected to the resistance Rs converting a current signal to a voltage signal. A voltage signal produced by the terminal CS is used as the signal of the feedback loop FB2.

In this embodiment, without being particularly limited, slope compensation circuit SC is provided. The slope compensation circuit SC forms a current signal corresponding to a RAMP waveform to supply the current signal to the resistance device converting it to a voltage signal via terminal RAMP. The voltage signal produced by the terminal RAMP is supplied to the emitter of the transistor T1. The voltage signal corresponding to sense current IL/5000 (=N) formed by the resistance Rs which is level shifted by the diode D is supplied to the base of the transistor T1. The voltage signal formed by the resistance Rs and the voltage signal corresponding to the RAMP waveform of the slope compensation circuit SC are added to the emitter of the transistor T1 to be transmitted to voltage comparison circuit VC1.

The output voltage Vout is divided by the voltage divider circuit having resistances R1 and R2 to be inputted to terminal FB. The divided voltage inputted to the terminal FB is inputted as the signal of the feedback loop FB1 to error amplifier EA. The error amplifier EA takes out a differential between the divided voltage and reference voltage Vref. The output signal of the error amplifier EA whose noise component is removed by the compensation circuit having the resistance and capacitor provided at the terminal EO is transmitted to the voltage comparison circuit VC1. The resistance and capacitor provided at terminal TRK form a soft start signal to transmit it to the error amplifier EA. The output voltage Vout immediately after power-on is controlled to rise softly corresponding to the soft start signal. Frequency setting of oscillation circuit OSC is performed by the capacitor connected to terminal CT to set the frequency of the PWM signal. The pulse formed by the oscillation circuit OSC is reset signal RES of flip-flop circuit FF forming the PWM signal.

In the peak current control system shown in FIG. 13, the reset signal RES formed by the oscillation circuit corresponds to reset pulse RP in the drawing and the flip-flop circuit FF is reset to allow the PWM signal obtained from invert output /Q to rise. This turns on the high potential side switch MOSFETQ10. The sense current IL/N is detected by MOSFETQ11 to be a voltage signal. The divided voltage of the output voltage Vout is compared with the differential output EO by voltage comparison circuit VC1. When the voltage corresponding to the IL/N reaches the voltage EO, the flip-flop circuit FF is set to change the PWM signal to the low level. This turns off the high potential side switch MOSFETQ10 and MOSFETQ11. The low potential side MOSFETQ12 is switched on.

MOSFETQ14 and MOSFETQ13 provided on the emitter side of the transistor T1 receive output signal Q of the flip-flop circuit FF to perform switch operation and is operated to provide hysteresis characteristic to the voltage comparison circuit VC1. As described above, when the flip-flop circuit FF is set, the MOSFETQ14 and MOSFETQ15 are turned on to forcefully turn off the transistor T1. The input potential of the voltage comparison circuit VC1 is lowered to maintain the set state until the flip-flop circuit FF is reset by the reset signal RES.

The logic circuit LGC has a circuit setting dead time so that the high potential side MOSFETQ10 and the low potential side MOSFETQ12 are not turned on at the same time, and a level shift circuit converting a control voltage transmitted to the high potential side MOSFETQ10 and MOSFETQ11 to a signal level corresponding to the boosted voltage.

As described above, as indicated by the dotted lines in the drawing, the high potential side switch MOSFETGH and the low potential side switch MOSFETGL are formed by one semiconductor chip. The oscillation circuit OSC, the error amplifier EA, the flip-flop circuit FF, the voltage comparison circuit VC1, the transistor T1, and the slope compensation circuit SC construct a PWM control circuit forming the PWM signal. The logic circuit LGC, the drivers DV1 and DV2, the power supply circuit REG, the differential amplification circuit AMP, and the MOSFETQ3 construct a driver circuit and are formed by one semiconductor chip.

Figure 5:
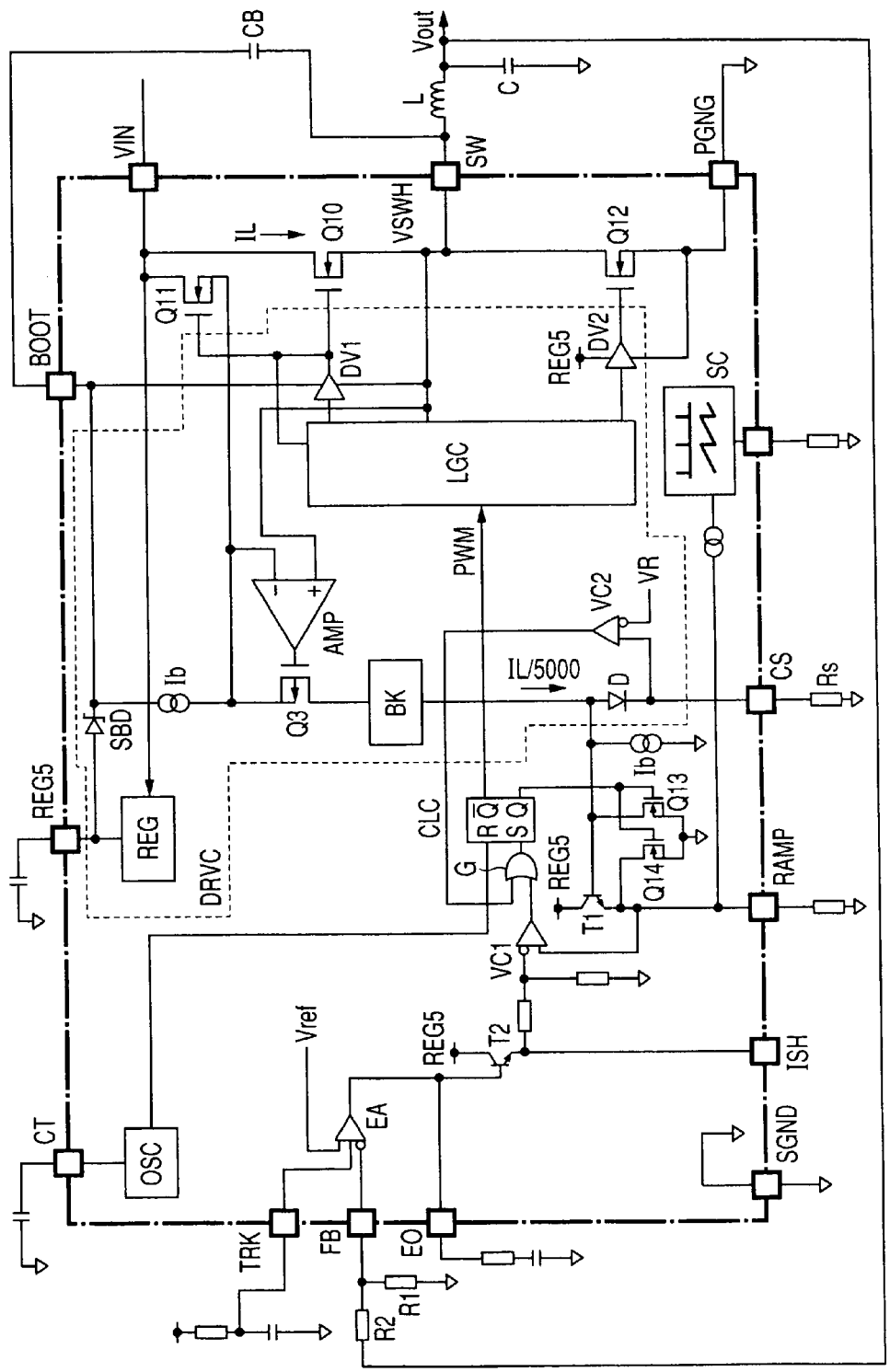
FIG. 5 is an overall block diagram showing another embodiment of the switching power supply device according to this invention.

FIG. 5 shows an overall block diagram of another embodiment of the switching power supply device according to this invention. In this embodiment, a current limiter circuit using sense current IL/5000 formed by MOSFETQ11 is added to the embodiment of FIG. 4. The current limiter circuit is realized by using a terminal voltage of the external resistance Rs. Reference voltage VR corresponding to the limiter current and the voltage formed with the resistance Rs are detected by voltage comparison circuit VC2 to bring the flip-flop circuit FF into the set state via OR gate circuit G. The high potential side switch MOSFETQ10, MOSFETQ11, and MOSFETQ12 are turned off. The sense current produces noise at switching. Blanking circuit BL of about several tens of ns is provided for detecting the sense current for preventing malfunction.

In this embodiment, when the semiconductor integrated circuit devices according to this invention are connected in parallel, the outputs of the error amplifiers EA are connected to be used for high accuracy current share. In the current share, the output of the error amplifier EA is connected to external terminal ISH via the diode (the base and emitter of transistor T2). For instance, the external terminals ISH of two switching power supply devices are interconnected. The external terminals ISH are interconnected to share the output voltages of the error amplifiers EA of the two switching power supply devices to operate to form the similar output voltage Vout. Sharing is possible. The output current supply capability can be doubled,.

Figure 6:
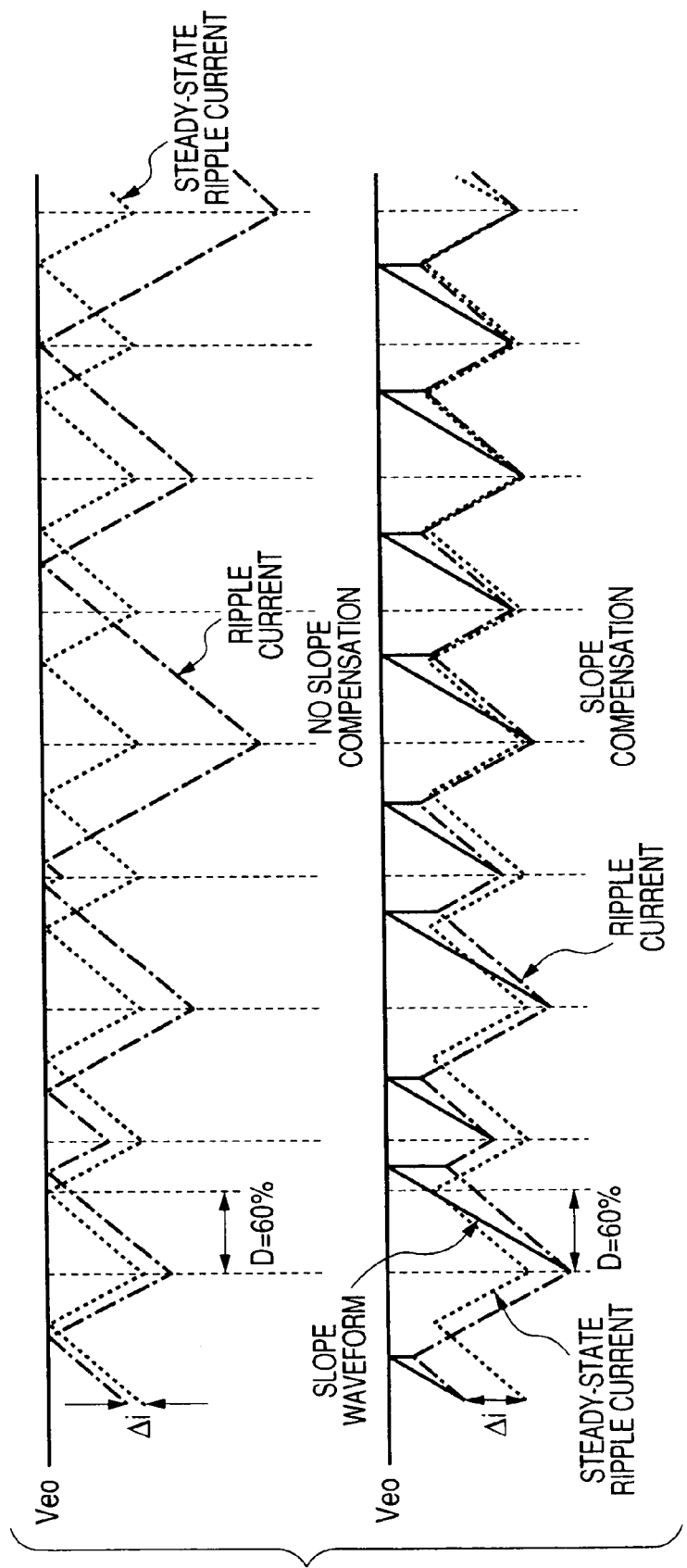
FIG. 6 is a waveform diagram of assistance in explaining the operation of a slope compensation circuit of FIGS. 4 and 5.

FIG. 6 shows a waveform diagram of assistance in explaining the operation of the slope compensation circuit. The drawing shows comparison of the case of no slope compensation and the case of slope comparison. The drawing shows a steady-state ripple current waveform by the dotted line when duty D of a PWM signal is 60% and the input of noise like Δi by the solid line. As shown in the drawing, in the case of no slope compensation, the noise current of the Δi displaces the ripple current from the steady-state ripple current for oscillation operation. In the case of slope compensation, when noise current like Δi is inputted, the slope waveform is added to focus to the steady-state ripple current waveform. Voltage Veo in the drawing corresponds to the voltage EO of FIG. 13.

Figure 7:
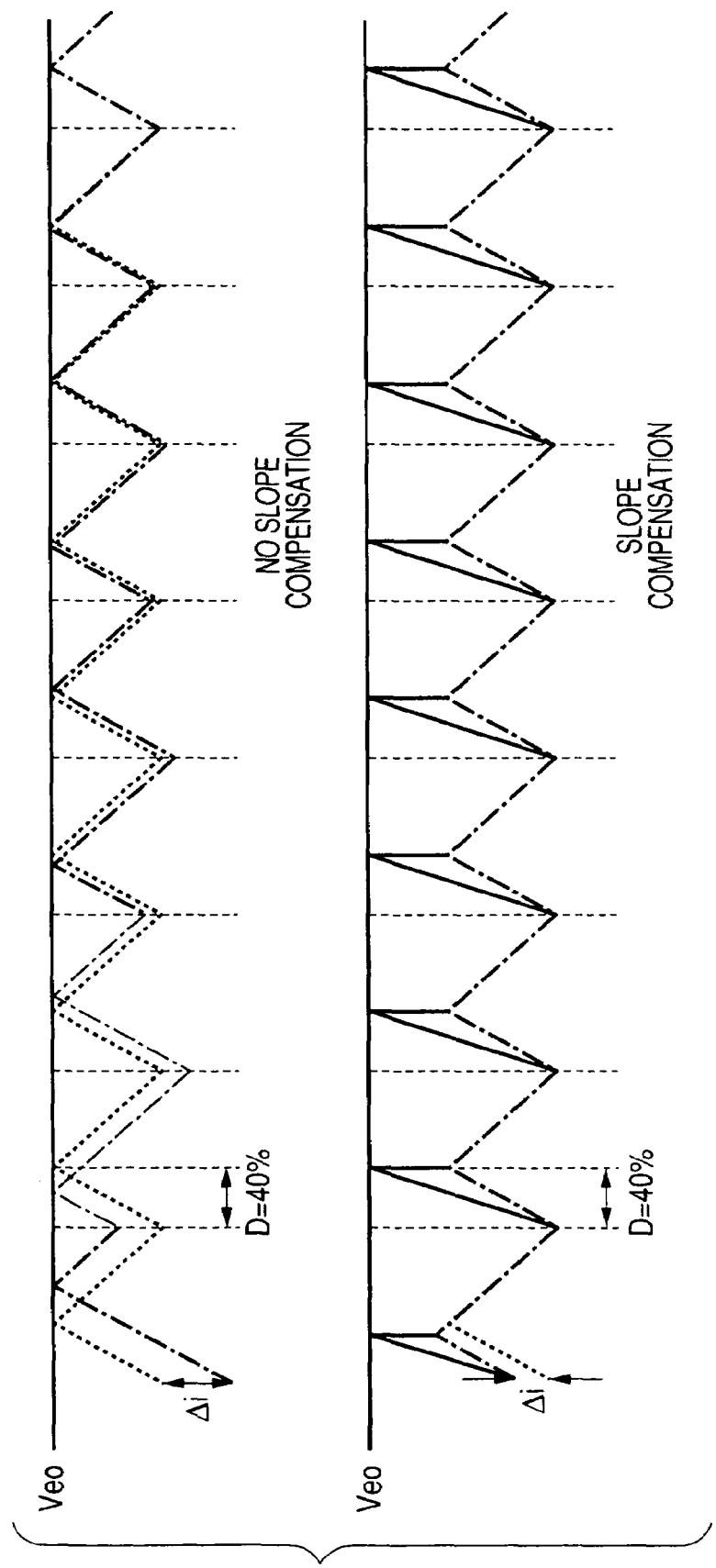
FIG. 7 is another waveform diagram of assistance in explaining the operation of the slope compensation circuit of FIGS. 4 and 5.

FIG. 7 shows another waveform diagram of assistance in explaining the operation of the slope compensation circuit. The drawing shows comparison of the case of no slope compensation and the case of slope compensation like FIG. 6 by an example in which duty D of a PWM signal is 40%. Instable operation having dutyD below 50%, slope compensation is performed to increase focusability as compared with the case of no slope compensation. Such slope compensation is described in detail in the Non-Patent Document 1.

Figure 8:
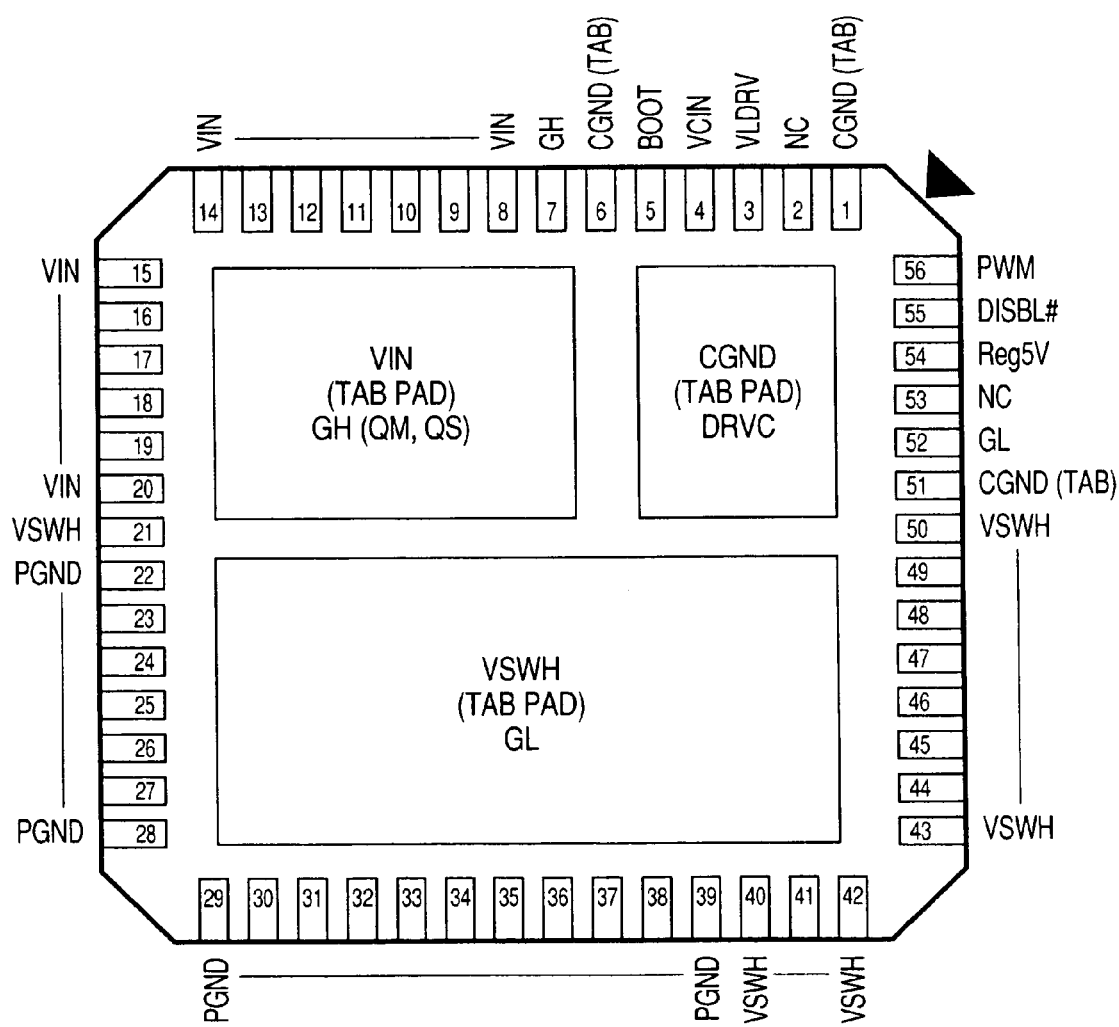
FIG. 8 is a block diagram showing an embodiment of a semiconductor integrated circuit device used for the switching power supply device according to this invention.

FIG. 8 shows a block diagram of an embodiment of a semiconductor integrated circuit device used for the switching power supply device according to this invention. The drawing illustrates the pin arrangement and the inner construction corresponding to an actual semiconductor integrated circuit device. In this embodiment, the semiconductor integrated circuit device is a multi-chip module integrated circuit in which three semiconductor chips are mounted over one package. The semiconductor chip has the high potential side switch MOSFETGH, the low potential side switch MOSFETGL, and control circuit DRVC. The high potential side switch MOSFETG is constructed by the main MOSFETQM (Q10) and the sense MOSFETQS (Q11). The low potential side switch MOSFETGL is constructed by the MOSFETQ12. As indicated by the dotted line in FIG. 5, like the control circuit DRVC, the semiconductor integrated circuit device is constructed by a semiconductor chip having the drivers DV1 and DV2, the logic circuit LGC, the differential amplification circuit AMP, the MOSFETQ3, and the power supply circuit REG. When the switching power supply device like FIG. 5 is constructed, the circuit of the control part forming the PWM signal of the control circuit is constructed in the semiconductor integrated circuit device of a different chip externally provided.

The semiconductor integrated circuit device of this embodiment is provided with 1 to 56 external terminals around the chip. The signal or voltage as shown in the drawing is supplied to each of them. Alternatively, the external components are connected. The semiconductor integrated circuit device is provided on its back surface side with the input terminal VIN, the output terminal SW, and a tab pad like CGND. All control circuits of FIG. 4 or 5 may be incorporated into the control circuit DRVC.

Typically, when the sense MOS system as described above is employed, sense MOSFETQS and main MOSFETQM need be devices of the same construction since a pair ratio thereof is important. The semiconductor integrated circuit device need be a device of one chip construction in which power MOSFETs are incorporated into a control IC. The discrete construction in which the controller and the power MOSFETs are mounted over different chips cannot obtain the sense current. When the power MOSFETs are incorporated into the control IC in one chip construction, the characteristic of the power MOSFETs is deteriorated more significantly than that of discrete power MOSFETs. It cannot be used for large current application to limit a current capacitance.

The vertical type construction MOSFETs like this embodiment are used to dispose, in one semiconductor chip CP1, the main MOSFETQM on the high potential side and the sense MOSFETQS having the same construction as that of the main MOSFETQM and being 1/N times the main MOSFETQM. The pair ratio variation in the threshold voltage Vgs and the ON-state resistance of both the MOSFETQM and the MOSFETQS caused in the manufacturing process can be minimum. The ON-state resistance with temperature rise is similarly increased or decreased in the main MOSFETQM and the sense MOSFETQS. The sense current has less temperature dependence. A high accuracy differential amplification circuit like FIG. 2 is combined with the MOSFETQM and the MOSFETQS, detecting a high accuracy sense current which can be used in peak current control.

Figure 9:
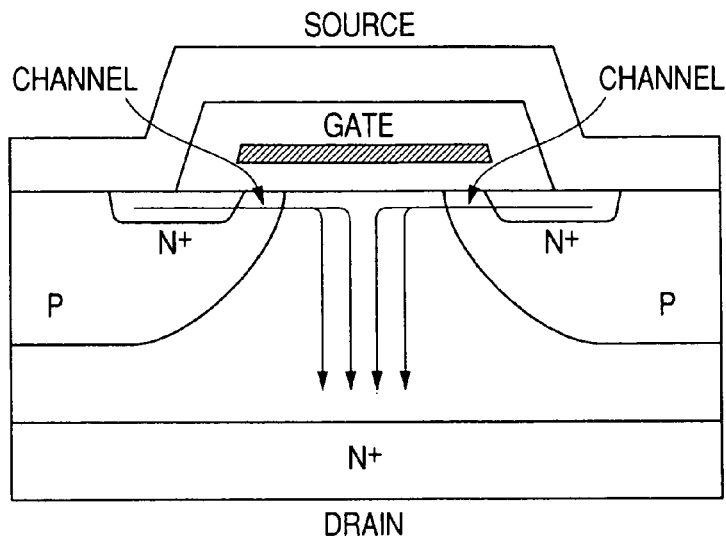
FIG. 9 is a device section block diagram showing an embodiment of a vertical type power MOSFET used in this invention.
Figure 10:
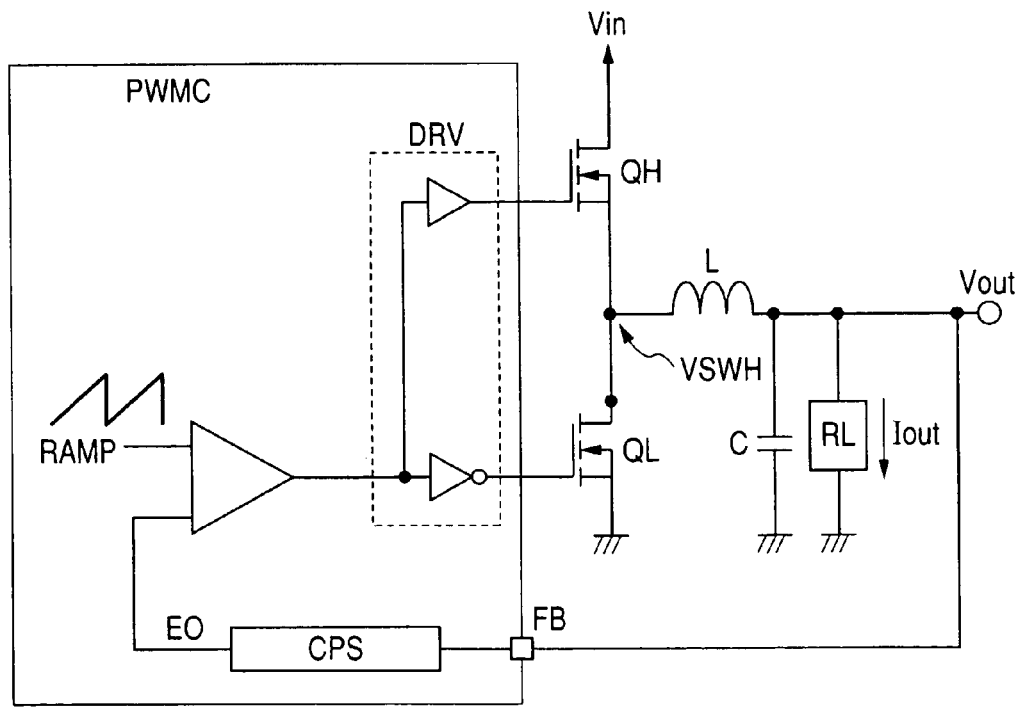
FIG. 10 is a schematic block diagram of a voltage drop type switching power supply device of a voltage control system which has been studied prior to this invention.
Figure 11:
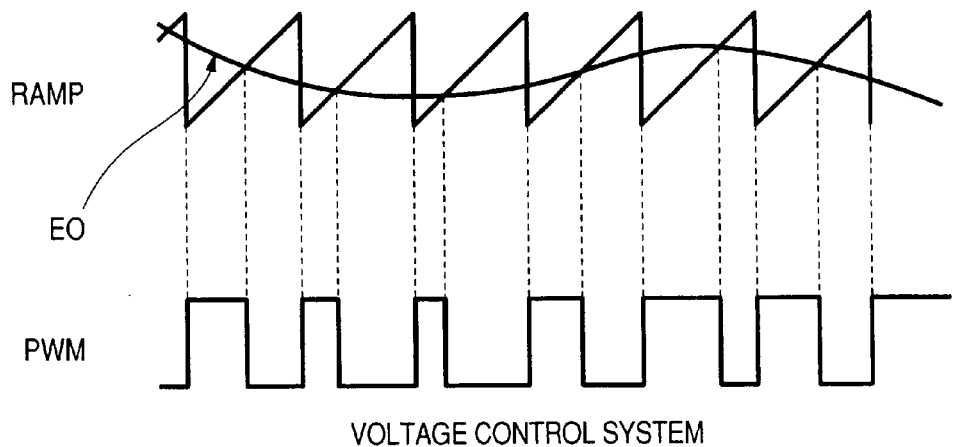
FIG. 11 is an operating waveform diagram of the switching power supply device of FIG. 10.

FIG. 9 shows a device section block diagram of an embodiment of the vertical type power MOSFETQ10 to MOSFETQ12 used as the high potential side switch MOSFET and the low potential side switch MOSFET. The drawing illustrates one MOSFET (cell). The drain N+ region is on the lower side of a silicon substrate. The gate electrode covers the entire surface of an N layer interposed between channels to release electric field concentration below the gate. Electrons horizontally passes from the source of N+ layer through the channels to reach the N layer. The positive voltage below the gate electrode allows the surface of the N layer to be an N+ stack layer. Electrons are flowed vertically to the entire surface of the N layer via such N+ stack layer to reach the drain. The power MOSFET of this embodiment is called a vertical type construction from the above electron flow.

The channels and the source of the N+ layer are formed in a ring state so as to surround the N layer in the center part. The P layer formed with the channels and the source (N+ layer) acts as the separation region of the cell. The shapes of the source, the channels, and the N layer in the center part are hexagonal and plural cells are arranged in a honeycomb form. For instance, the MOSFETQ10 is formed by 20000 cells. The MOSFETQ11 is formed by four cells. The MOSFETQ10 and the MOSFETQ11 have an area ratio (current ratio) of 5000:1. The drains of the MOSFETQ10 and the MOSFETQ11 are shared on the back surface of the substrate. The gates are sharably connected by a metal wiring layer on the surface side. The sources of the 20000 cells are sharably connected by the metal wiring layer on the surface illustrated in the drawing. The four cells are interconnected by the metal wiring layer. MOSFETGL has the similar construction in the absence of the sense MOSFET.

Figure 18:
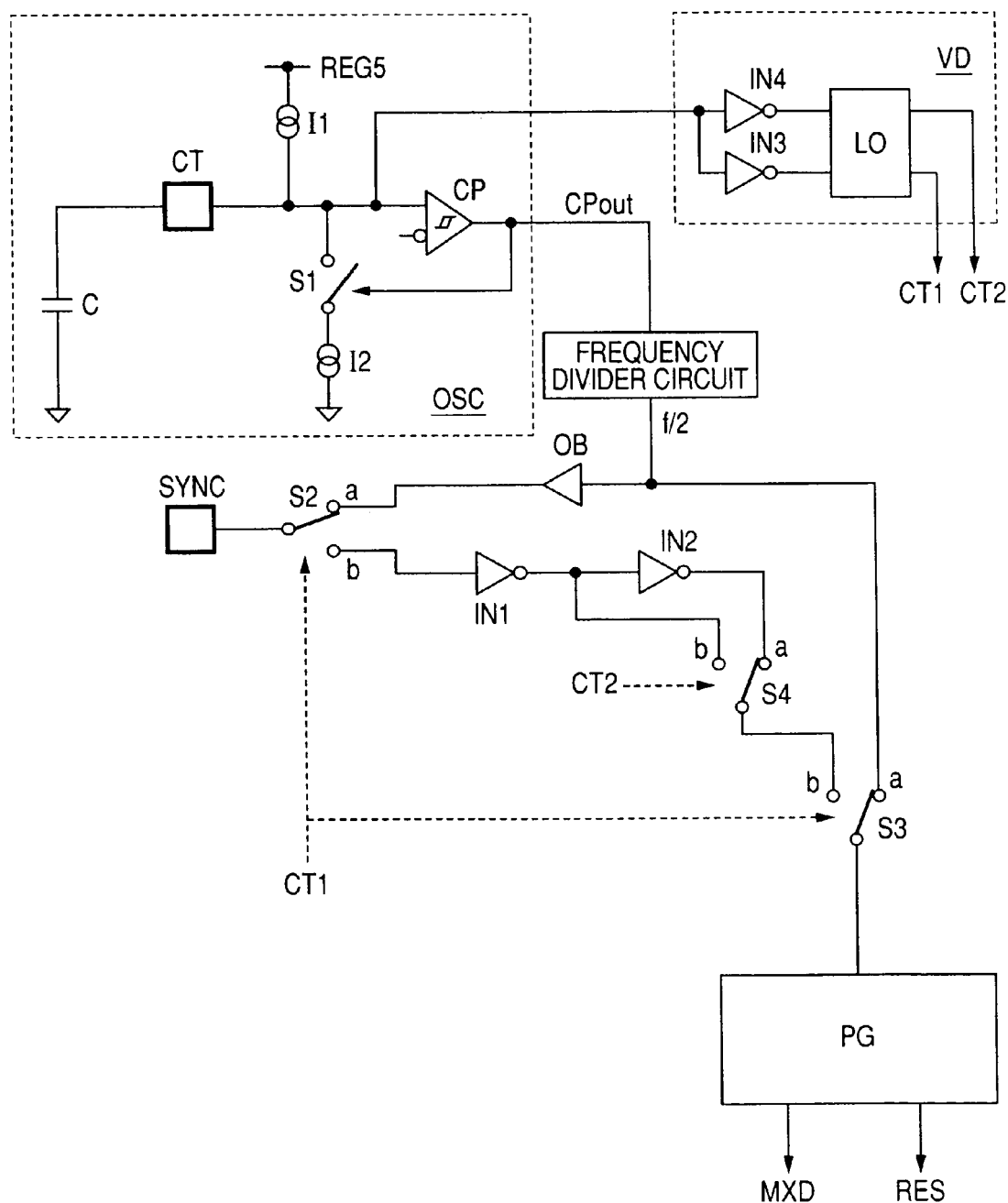
FIG. 18 is a block diagram showing an embodiment of oscillation circuit OSC and pulse generation circuit PG used for the switching power supply device according to this invention.

FIG. 18 shows a block diagram of an embodiment of the oscillation circuit OSC and pulse generation circuit PG used in the switching power supply circuit according to this invention. The oscillation circuit OSC has the capacitor C connected to the external terminal CT, constant current sources I1 and I2, switch S1, and hysteresis comparator CP. The constant current source I1 flows a charged current from the supply voltage REG5 to the capacitor C. The on state of the switch S1 flows a constant current larger than the constant current source I1 toward the circuit ground potential. A differential current (I2-I1) discharges the capacitor C. The hysteresis comparator CP has a first state in which the voltage of the external terminal CT is transit from a first threshold voltage V1 to a second threshold voltage V2 lower than that, and a second operation state in which the voltage of the external terminal CT is transit from the second threshold voltage V2 to the first threshold voltage V1. For instance, when the hysteresis comparator CP is in the first operation state, output signal CPout is brought to the low level to turn off the switch S1. When the hysteresis comparator CP becomes in the second operation state, the output signal CPout is brought to the high level to turn on the switch S1.

When the voltage of the capacitor C is low and the hysteresis comparator CP is in the second operation state, the switch S1 is turned off. The capacitor C is charged by the constant current source I1. When the voltage of the capacitor C reaches the first threshold voltage V1, the output signal CPout of the hysteresis comparator CP is changed from the low level to the high level to be brought into the first operation state. The switch S1 is turned on. The switch S1 is on to switch the capacitor C to the discharge operation by the differential current. When the voltage of the capacitor C reaches the second threshold voltage V2, the hysteresis comparator CP changes the output signal CPout to the low level to be brought into the second operation state again. The switch S1 is turned off. Such operation is repeated to change the potential of the capacitor C in the range of the first threshold voltage V1 and the second threshold voltage V2.

Frequency f of the output signal CPout of the oscillation circuit OSC is divided by a factor of 2 using the frequency divider circuit. The frequency divided output f/2 is inputted to the pulse generation circuit PG via the contact "a" side of switch S3. The frequency divided output f/2 is outputted from external terminal SYNC via output buffer OB and the contact "a" side of switch S2. The signal from the external terminal SYNC is inputted to the pulse generation circuit, PG via the contact "b" side of the switch S2, inverter circuits IN1 and IN2, the contact "a" side of switch S4, and the contact "b" side of the switch S3. The output signal of the inverter circuit IN1 is inputted to the pulse generation circuit PG via the contact "b" side of the switch S4 and the contact "b" side of the switch S3 bypassing the inverter circuit IN2.

The switches S2 and S3 are controlled by control signal CT1. The switch S4 is controlled by control signal CT2. The control signals CT1 and CT2 are formed by voltage judge circuit VD. The voltage judge circuit VD performs a judge operation of whether the potential of the capacitor C is higher than the first threshold voltage V1 or is lower than the second threshold voltage V2, or is within the range of the first threshold voltage and the second threshold voltage V2. For instance, in the potential of the capacitor C, the output signals of inverter circuit IN3 having a first logic threshold voltage lower than the first threshold voltage V1 and inverter circuit IN4 having a second logic threshold voltage higher than the second threshold voltage V2 are supplied to logic circuit LO. A combination thereof forms the control signals CT1 and CT2.

When the potential of the capacitor C is lower than the judge voltage and is higher than the second logic threshold voltage, the control signal CT1 is brought to the low level to connect the switches S2 and S3 to the contact "a" side. When the potential of the capacitor C is higher than the first logic threshold voltage or is lower than the second logic threshold voltage, the control signal CT1 is brought to the high level to connect the switches S2 and S3 to the contact "b" side. When the potential of the capacitor C is lower than the second logic threshold voltage, the control signal CT2 is brought to the low level to connect the switch S4 to the contact "a" side. When the potential of the capacitor C is higher than the first logic threshold voltage, the control signal CT2 is brought to the high level to connect the switch S4 to the contact "b" side.

The pulse generation circuit PG forms the reset signal RES and maximum duty signal MXD for forming the later-described PWM signal in response to a pulse signal inputted via the frequency divided output f/2 or the external terminal SYNC of the oscillation circuit via the signal transmission paths having the switches S2 to S4.

Figure 19:
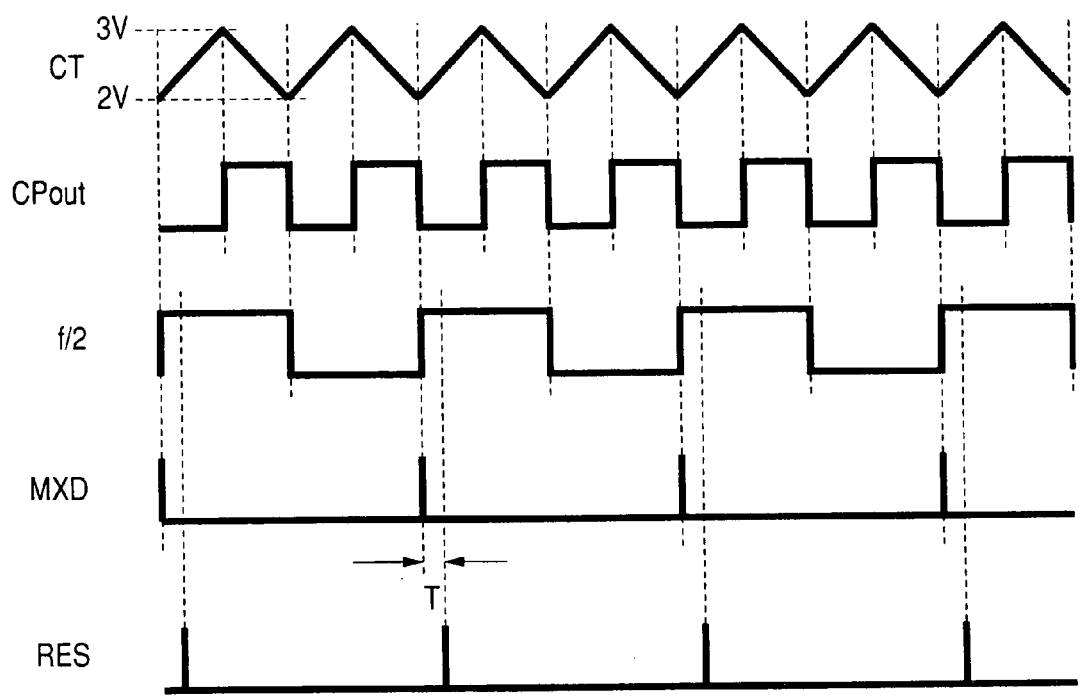
FIG. 19 is a waveform diagram of assistance in explaining the operation of the oscillation circuit OSC and the pulse generation circuit PG of FIG. 1.

FIG. 19 shows a waveform diagram of assistance in explaining the operation of the oscillation circuit OSC and the pulse generation circuit PG of FIG. 18. 3V corresponds to the first threshold voltage V1. 2V corresponds to the second threshold voltage V2. The electric current of the constant current source I2 is twice the electric current of the constant current source I1. The external terminal CT connected to the capacitor C has a triangle wave charged/discharged by the electric current corresponding to the constant current I1. The output signal CPout of the hysteresis comparator CP is brought to the low level in charge operation and is brought to the high level in discharge operation. The frequency F is $F \text{ (Hz)} = I1(A)/[2 \times C(F)] \times 1V$. Here, C (F) is a capacitance value of the capacitor C. 1V is a potential difference between the first threshold voltage V1 and the second threshold voltage V2.

The output signal f/2 of the frequency divider circuit is a pulse obtained by frequency dividing the output signal CPout of the oscillation circuit OSC by a factor of 2. The pulse generation circuit generates the maximum duty signal MXD when the frequency divided output f/2 rises from the low level to the high level and generates the reset pulse RES at timing delayed by time T (e.g., 50 ns).

Figure 20:
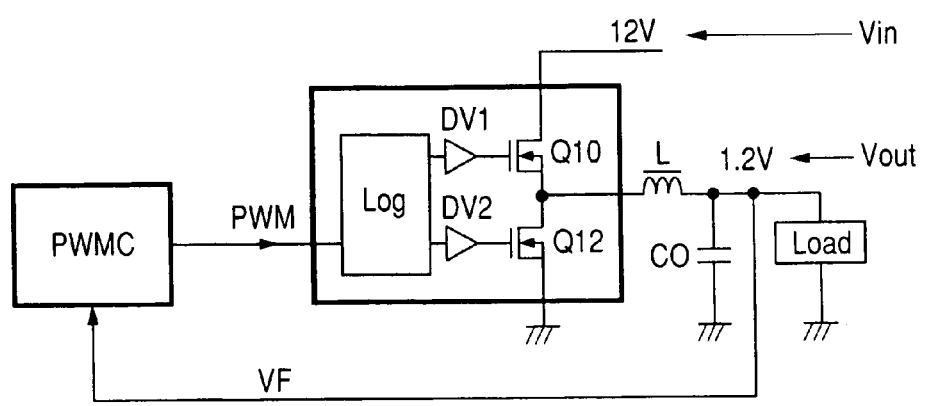
FIG. 20 is a partial schematic circuit diagram showing an embodiment of the switching power supply device according to this invention.

FIG. 20 shows a partial schematic circuit diagram of an embodiment of the switching power supply circuit according to this invention. This embodiment is intended for a voltage drop type switching power supply circuit which forms the output voltage Vout obtained by dropping the input voltage Vin. Without being particularly limited, the input voltage Vin is a relatively high voltage of about 12V and the output voltage Vout is a low voltage of about 1.2V.

The input voltage Vin supplies an electric current from the input side of the inductor L via the high potential side switch MOSFETQ10. Capacitor CO is provided between the output side the inductor L and the circuit ground potential GND. The output voltage Vout smoothened by such capacitor CO is formed. The output voltage Vout is the operating voltage of the load circuit Load such as a microprocessor CPU. The switch MOSFETQ12 is provided between the input side of the inductor L and the circuit ground potential VSS. The MOSFETQ12 is turned on when the switch MOSFETQ10 is off so that the input side of the inductor L is the circuit ground potential to clamp a counter electromotive voltage produced in the inductor L. The switches MOSFETQ10 and MOSFETQ12 are constructed by N channel type power MOSFETs. As described above, the junction of the switch MOSFETQ10 and MOSFETQ12 is connected to the input side of inductor L1.

The output voltage Vout is fed back as feedback signal VF to PWM generation circuit PWMC. The PWM generation circuit PWMC receives the feedback signal VF to generate the PWM signal controlling the output voltage Vout to a voltage of about 1.2V for transmitting it to control circuit Log. The control circuit Log forms a high voltage signal and a low potential side signal corresponding to the PWM signal. Dead time so that the MOSFETQ10 and MOSFETQ12 are not turned on at the same time is set to both the signals. The high potential side signal is transmitted to the gate of the high potential side switch MOSFETQ10 via the driver DV1 having a level shift (level conversion) function as described later. The low potential side signal is transmitted to the gate of the low potential side switch MOSFETQ12 via the driver DV2.

Figure 21:
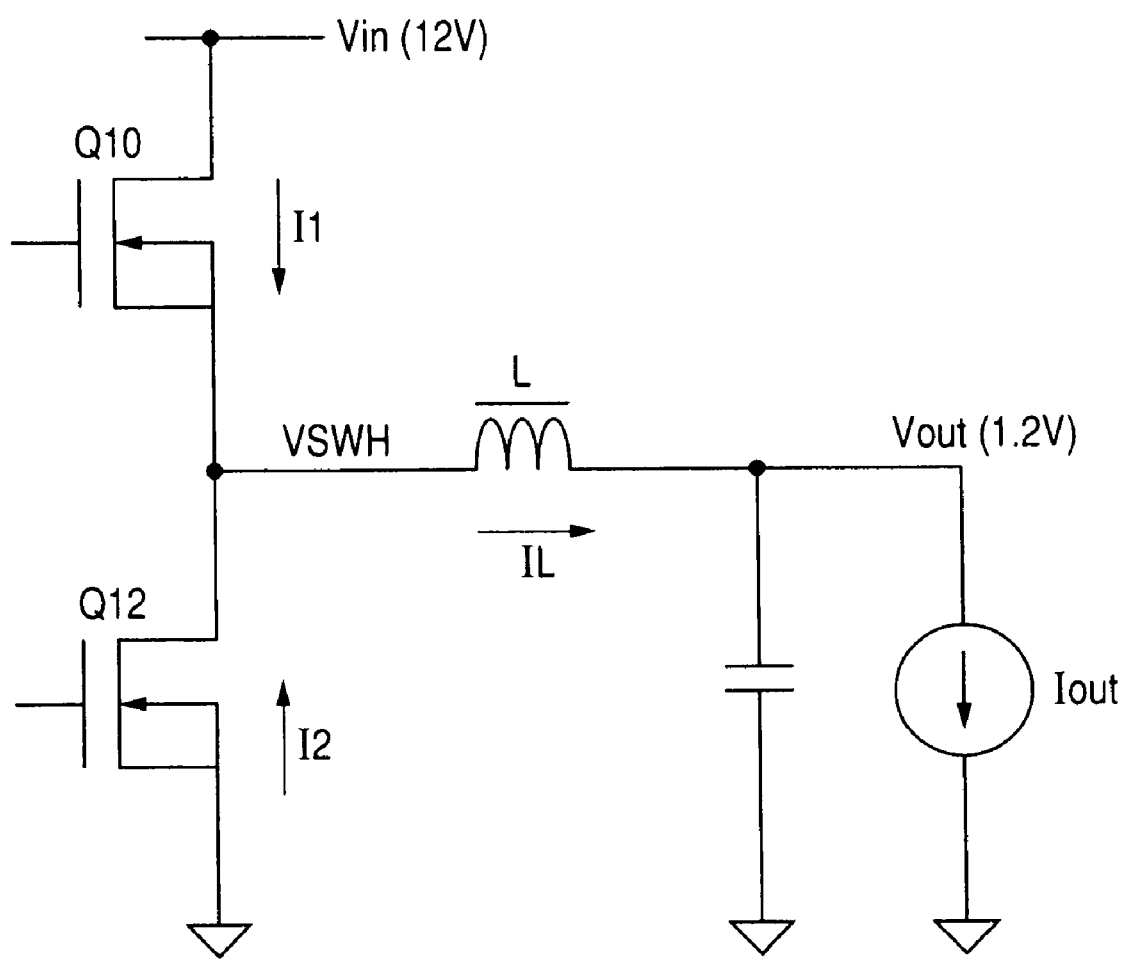
FIG. 21 is an essential part circuit diagram of assistance in explaining the operation of the switching power supply device FIG. 20.
Figure 22:
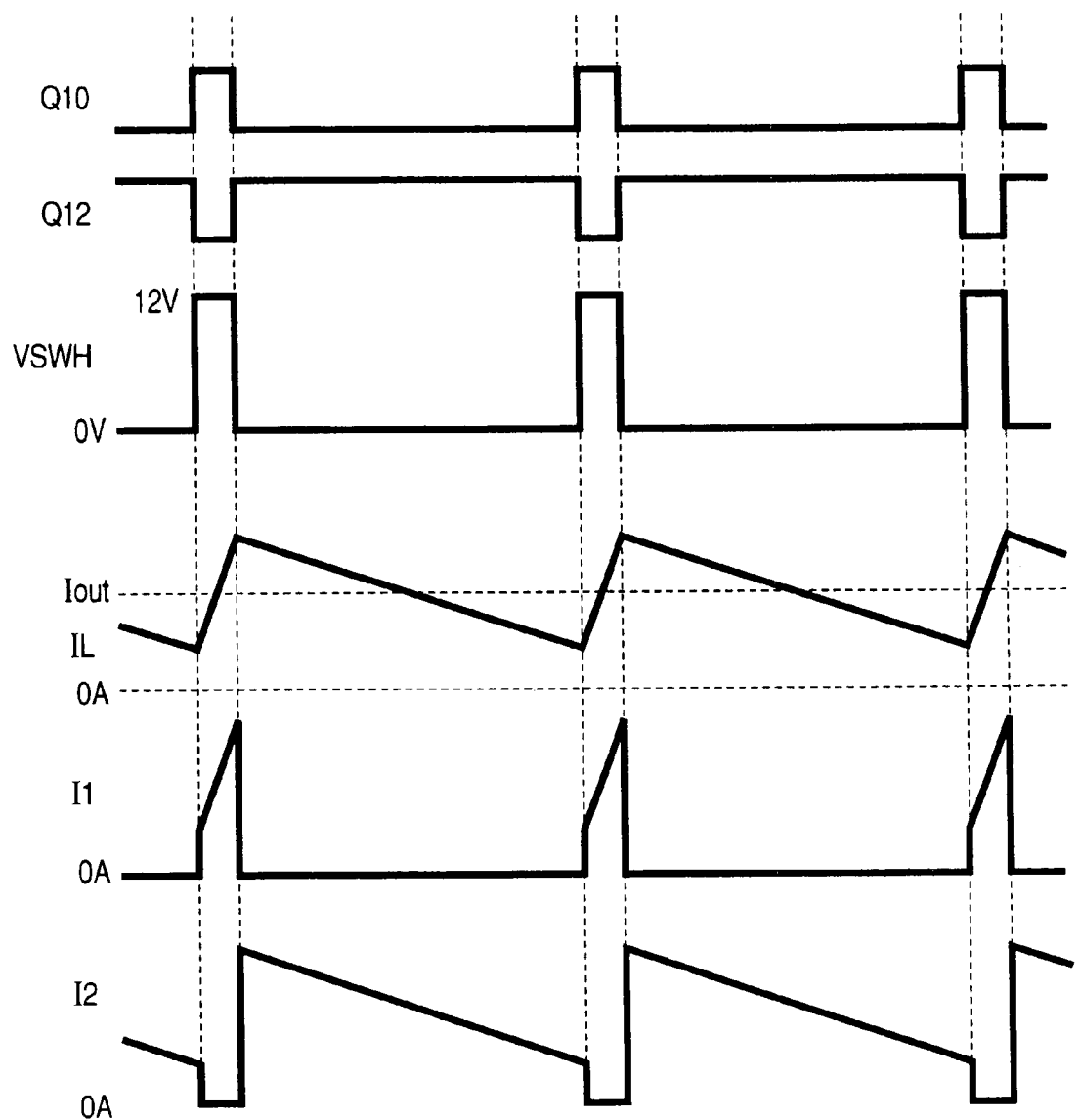
FIG. 22 is an operation explanatory diagram of FIG. 21.

FIG. 21 shows an essential part circuit diagram of assistance in explaining the operation of the switching power supply circuit of FIG. 20. FIG. 22 shows an operating waveform diagram thereof. As shown in FIG. 21, the electric current I1 is supplied to the input side of the inductor L via the high potential side switch MOSFETQ10 switch controlled by the PWM signal (pulse width control signal). The output capacitor CO is provided between the output side of the inductor L and the circuit ground potential to obtain the output voltage Vout. The low potential side switch MOSFETQ12 is provided between the inductor L and the ground potential. The MOSFETQ12 voltage clamps the input side of the inductor L when the MOSFETQ10 is turned off to circuit ground potential VSS to flow the electric current I2 corresponding to the electric current IL supplied to the load via the inductor L. The MOSFETQ10 and MOSFETQ12 are turned on alternately. The midpoint voltage VSWH has a waveform reciprocated between 0V (VSS) and the input voltage Vin. Stabilizing of the output voltage Vout is achieved by adjusting the duty of the PWM. In FIG. 22, the average current of the electric current IL flowed to the inductor L is equal to load current Iout.

Figure 23:
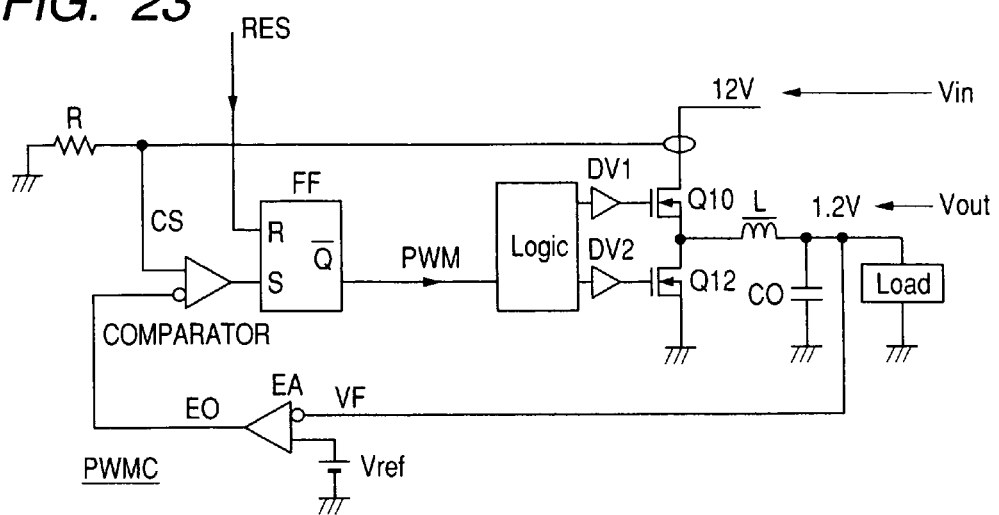
FIG. 23 is an overall schematic circuit diagram showing an embodiment of the switching power supply device according to this invention.

FIG. 23 shows an overall schematic circuit diagram of an embodiment of the switching power supply circuit according to this invention. The PWM generation circuit PWMC of the switching power supply circuit of this embodiment is of a peak current control system. In the peak current control system, in addition to the feedback loop feeding back the output voltage Vout, the feedback loop in which the input current IL/N is monitored and fed back is provided. The instable element of the feedback loop system is cancelled to facilitate phase compensation. The loop gain need not be dropped excessively. The switching power supply circuit can be a circuit suitable for fast load response of the power supply. The PWM generation circuit PWMC of this embodiment generates the PWM signal from the invert signal /Q of the flip-flop circuit FF. The flip-flop circuit FF is reset by the reset signal RES formed by the pulse generation circuit PG of FIG. 18. It is set by the output signal EO of the error amplifier EA receiving the feedback signal VF and the reference voltage Vref corresponding to the output voltage Vout and the output signal of the comparator receiving the signal CS formed by sensing an electric current flowed to the high potential side switch MOSFETQ10.

Figure 24:
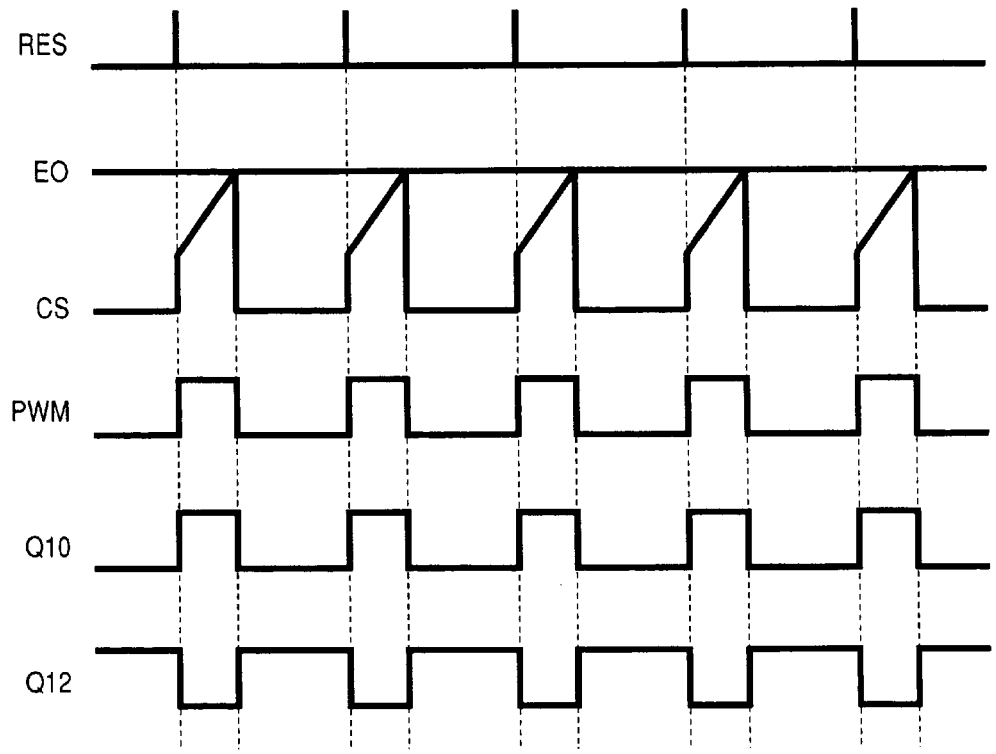
FIG. 24 is a waveform diagram of assistance in explaining the operation of the switch power supply device of FIG. 23.

FIG. 24 shows a waveform diagram of assistance in explaining the operation of the switching power supply circuit of FIG. 23. In such peak-to-peak current control system, reaching of the reset signal RES resets the flip-flop circuit FF so that the PWM signal is brought to the high level to turn on the high potential side switch MOSFETQ10. An electric current corresponding to the electric current I1 of the MOSFETQ10 is flowed to resistance R to form monitor voltage CS. The comparator inverts the flip-flop circuit FF when the monitor voltage CS reaches the output signal EO of the error amplifier EA, thereby changing the PWM signal from the high level to the low level. The PWM signal is formed by the monitor voltage CS of the electric current corresponding to the output current I1 to realize a fast load response. When the PWM signal is changed from the high level to the low level, the high potential side MOSFETQ10 is turned off and the low potential side MOSFETQ12 is switched on.

Figure 25:
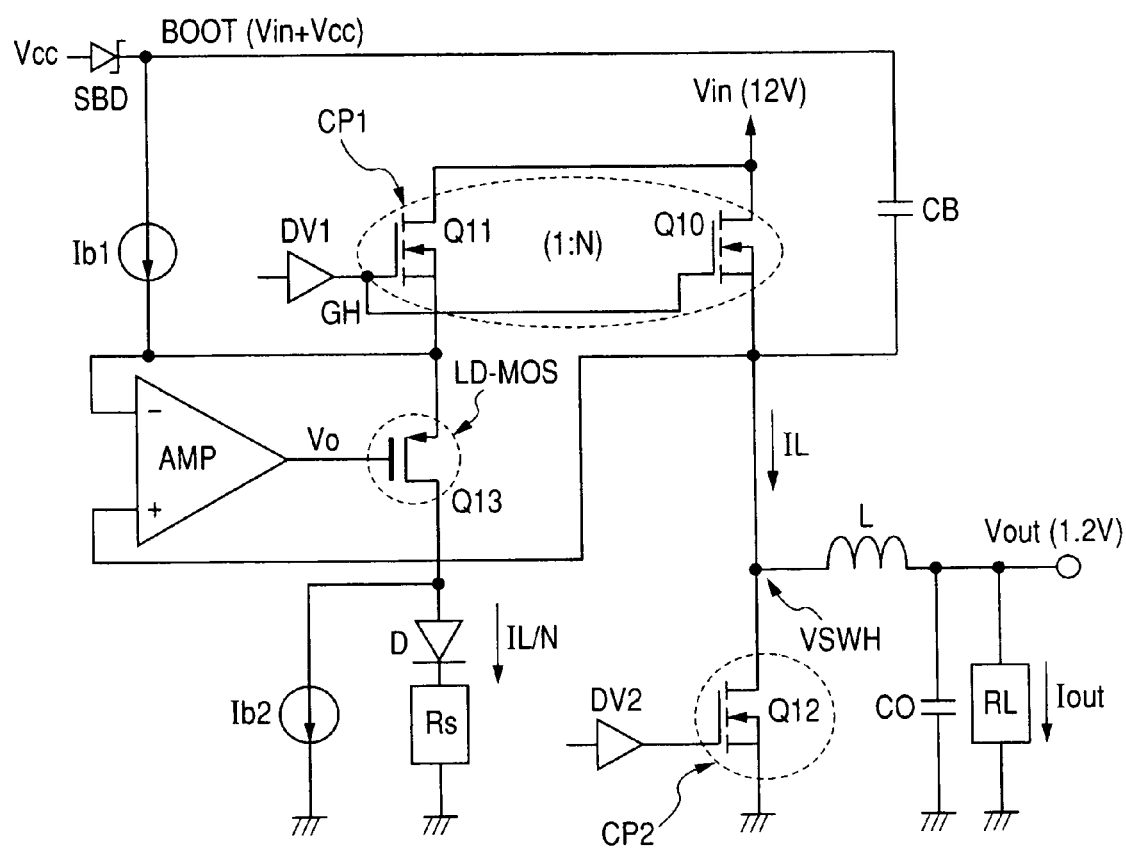
FIG. 25 is an essential part schematic circuit diagram showing an embodiment of the switching power supply device FIG. 23.

FIG. 25 shows an essential part schematic circuit diagram of an embodiment of the switching power supply circuit of FIG. 24. The input voltage Vin, the high potential side switch MOSFETQ10, the inductor L, the MOSFETQ12, and the drivers DV1 and DV2 are the same as those of FIG. 23. Without being particularly limited, the switch MOSFETQ10 and MOSFETQ12 are constructed by the vertical type power MOSFETs of N channel type. As described above, the junction of the switch MOSFETQ10 and MOSFETQ12 is connected to the input side of the inductor L. The MOSFETQ10, MOSFETQ11, and MOSFETQ12 in the drawing correspond to MOSFETQM, MOSFETQS, and MOSFETGL of FIG. 1. The capacitor Co corresponds to the capacitor C of FIG. 1.

In this embodiment, the sense MOSFETQ11 is provided to the high potential side switch MOSFETQ10. The MOSFETQ10 and the MOSFETQ11 are formed over one semiconductor chip CP1. The MOSFETQ10 forms the electric current IL as the high potential side switch MOSFET. The MOSFETQ11 is a sense MOSFET monitoring the electric current IL flowed to the MOSFETQ10. As described later, these are vertical type MOSFET formed over one semiconductor substrate. The area ratio is e.g., N:1 (e.g., 5000:1). An electric current of IL/N (IL/5000) is flowed by the MOSFETQS. The low potential side switch MOSFETQ12 is formed by one semiconductor chip CP2.

The drains and the gates of the MOSFETQ10 and MOSFETQ11 are integrally formed over the semiconductor substrate and have the same voltage. The MOSFETQ10 and MOSFETQ11 are operated as source follower output MOSFETs. To obtain the electric current IL/N corresponding to the area ratio, the source potentials of both the MOSFETQ10 and the MOSFETQ11 need be equal. The source potentials of both the MOSFETQ10 and the MOSFETQ11 are supplied to the positive phase input (+) and the negative phase input (−) of the differential amplification circuit AMP, respectively. The output voltage Vo of the differential amplification circuit AMP is supplied to the gate of the P channel MOSFETQ13. The source of the MOSFETQ13 is connected to the source of the MOSFETQ11. Without being particularly limited, the drain of the MOSFETQ13 is provided with the diode D and the resistance Rs. The resistance Rs forms a voltage signal corresponding to the sense current IL/N of the MOSFETQ11. This voltage is one feedback signal CS for forming a PWM signal.

Without being particularly limited, in this embodiment, the source side and the drain side of the MOSFETQ13 are provided with bias current sources Ib1 and Ib2. The bias current sources Ib1 and Ib2 are not particularly limited and are constructed by current mirror MOSFETs operated by a shared current to flow the same bias current. The MOSFETQ13 is provided with such bias current sources Ib1 and Ib2. Even at no load in which the sense current is almost zero, the drain voltages of the main MOSFETQ10 and the sense MOSFETQ11 are normally equal to flow the sense current at high accuracy. While maintaining such state, an offset caused due to the flow of the bias current flowed to the MOSFETQ13 into the resistance Rs can be prevented.

The voltage formed by the resistance Rs is used as the feedback signal CS of the peak current control system using two feedback loops VF and CS as shown in FIG. 23, as described above. The PWM generation circuit PWMC of the peak current control system shown in FIG. 23 forms the PWM signal controlling the output voltage Vout to a voltage of about 1.2V. The resistance Rs forms the PWM signal by a comparison signal of the peak value of the voltage CS (IL/N) corresponding to the sense current as shown in FIG. 24 and the output signal EO of the error amplifier EA receiving the divided voltage obtained by dividing the output voltage Vout by the voltage divider circuit, not shown and the reference voltage. The PWM signal performs switch control of the switch MOSFETQ10 and MOSFETQ12.

In this embodiment, the N channel type power MOSFETQ10 of low ON-state resistance and low Qgd is used as the high potential side switch device to be operated as a source follower output circuit. To obtain the high voltage BOOT in the midpoint potential corresponding to the input voltage Vin, in other words, to prevent loss due to the midpoint potential VSWH lowered by the threshold voltage of the MOSFETQ10, a boosting circuit is provided.

The boosting circuit operates to allow the gate voltage when the MOSFETQ10 is on to be a high voltage above the threshold voltage with respect to the input voltage Vin. The midpoint is connected to one end of the boot strap capacitance CB as shown. The other end of the boot strap capacitance CB is connected to the power terminal Vcc of 5V (REG5) via a switch device such as the Schottky diode SBD. When the low potential side switch MOSFETQ12 is on and the high potential side switch MOSFETQ10 is off, the boot strap capacitance CB is charged-up from the power terminal Vcc. When MOSFETQ12 is turned off and MOSFETQ10 is switched on, the gate voltage is boosted with respect to the source side potential of MOSFETQ10 by the charge-up voltage (Vin+

Vcc) of the boot strap capacitance CB. In this example, voltage loss by the Schottky diode SBD is neglected. The boosted voltage BOOT is used as an operating voltage of the driver DV1, the bias current source Ib1, and the differential amplification circuit AMP.

The circuit shown in FIG. 2 is used for the differential amplification circuit AMP of FIG. 25. The output voltage Vo of the differential amplification circuit AMP is connected to the gate of the MOSFETQ13. The positive phase input (+) and the negative phase input (−) of the differential amplification circuit AMP are connected to the sources of the main MOSFETQ10 and the sense MOSFETQ11. The drain voltages of the differential MOSFETQ1 and MOSFETQ2 in the differential amplification circuit AMP are equal like Vo=Vb. This means that the positive phase input (+) and the negative phase output (−) are equal so that the condition of Ib4=Ib3/2 is established. Increase and decrease in the sense current (IL/N) and Vth influence of the LD-MOSFETQ13 are eliminated. The systematic offset is cancelled. The offset voltage is small like 5.3 μV (microvolt) at most and the accuracy of the differential amplification circuit AMP can be increased.

In this embodiment, the offset voltage can be smaller to 5.3 μV at most so as to be neglected irrespective of increase and decrease in the sense current IL, as described above. The main current flowed to the main MOSFETQ10 can produce the output voltage Vo of the differential amplification circuit AMP from near zero ampere. Such output voltage Vo is lowered so as to compensate for increase in the gate and source voltage Vgs of MOSFETQ13 corresponding to increase in the main current IL. As described above, the source potentials of the main MOSFETQ10 and the sense MOSFETQ11 are equal to realize PWM control by the peak current control system at high accuracy.

Figure 26:
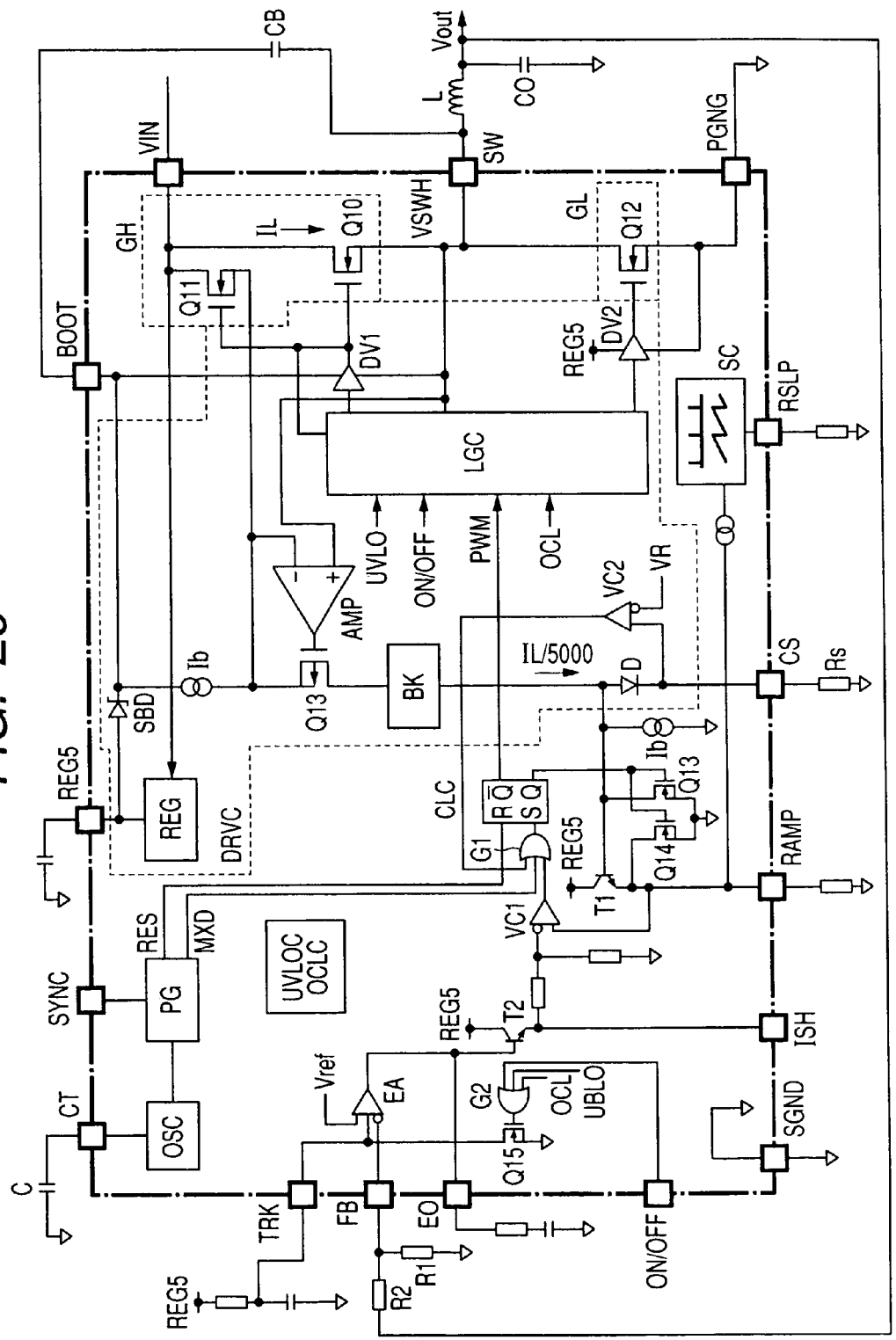
FIG. 26 is an overall block diagram showing an embodiment of the switching power supply device according to this invention.

FIG. 26 shows an overall block diagram of an embodiment of the switching power supply device according to this invention. Without being particularly limited, the part surrounded by the thick dash-single-dot line in the drawing indicates a semiconductor integrated circuit device of a multi-chip construction. Four semiconductor chips having two power MOSFETGH and MOSFETGL, the control circuit DVRC thereof, and others as indicated by the dotted line are mounted over one package. The high potential side switch MOSFETGH has the main MOSFETQ10 and the sense MOSFETQ11. The area ratio (current ratio) between the MOSFETQ10 and the MOSFETQ11 is set to 5000:1. The low potential side switch MOSFETGL has MOSFETQ12. The source of the MOSFETQ12 is connected to the independent external ground terminal PGND to reduce the influence of switching noise.

An input voltage of about 12V is supplied from the terminal VIN. The voltage of the terminal VIN is connected to the drains of the MOSFETQ10 and the MOSFETQ11 and is supplied to the power supply circuit REG. The power supply circuit REG receives the input voltage VIN of 12V to form an internal voltage (REG5) of about 5V. The terminal REG5 is connected to the stabilizing capacitor. The internal voltage (REG5) is an operating voltage of the logic circuit LGC forming a switch control signal of the high potential side switch MOSFETQ10 and MOSFETQ11 and the low potential side switch MOSFETQ12, the driver DV2 forming a driving signal supplied to the gate of the low potential side switch MOSFETQ12 and, without being particularly limited, an internal circuit such as the transistor T1 for slope compensation.

The internal voltage (REG5) is connected to one end of the boot strap capacitance CB via the Schottky diode SBD and the terminal BOOT constructing the boosting circuit. The other end of the boot strap capacitance CB is connected to the terminal SW. The terminal SW is connected to the source of the MOSFETQ10 and the drain of the MOSFETQ12 and is connected to the input side of the inductor L. The capacitor CO is provided between the other end of the inductor L and the circuit ground potential. The output voltage Vout of 1.2V is formed to be supplied to a load circuit such as a CPU, not shown.

The source of the MOSFETQ11 and the source of the MOSFETQ10 are connected to input terminals (+) and (−) of the differential amplification circuit AMP. The differential amplification circuit AMP is constructed by a circuit as shown in FIG. 2. The source potentials of the MOSFETQ10 and the MOSFETQ11 are equal for operation to obtain a high accuracy sense current. The MOSFETQ13 to which the sense current formed by the MOSFETQ11 is flowed has the LD-MOSFET. The source side and the drain side of such MOSFETQ13 are provided with the bias current source Ib corresponding to the bias current sources Ib1 and Ib2 shown in FIG. 25. The drain of the MOSFETQ13 is connected to the terminal CS via the blanking circuit BK and the diode D. The terminal CS is connected to the resistance Rs converting a current signal to a voltage signal.

A voltage signal produced by the terminal CS is used as the feedback signal CS. The reference voltage VR corresponding to the limiter current and the voltage formed with the resistance Rs are detected by the voltage comparison circuit VC2 to bring the flip-flop circuit FF into the set state via the OR gate circuit G1. The PWM signal is at low level. The high potential side switch MOSFETQ10 and MOSFETQ11 are turned off. The sense current produces noise at switching. The blanking circuit BK of about several tens of ns is provided for detecting the sense current for preventing malfunction.

In this embodiment, without being particularly limited, the slope compensation circuit SC is provided. The slope compensation circuit SC forms a current signal corresponding to a RAMP waveform to supply the current signal to the resistance device converting it to a voltage signal via the terminal RAMP. The voltage signal produced by the terminal RAMP is supplied to the emitter of the transistor T1. The voltage signal corresponding to sense current IL/5000 (=N) formed by the resistance Rs which is level shifted by the diode D is supplied to the base of the transistor T1. The voltage signal formed by the resistance Rs and the voltage signal corresponding to the RAMP waveform of the slope compensation circuit SC are added to the emitter of the transistor T1 to be transmitted to the voltage comparison circuit VC1.

The output voltage Vout is divided by the voltage divider circuit having the resistances R1 and R2 to be inputted to the terminal FB. The divided voltage inputted to the terminal FB is inputted as the feedback signal VF to the error amplifier EA. The error amplifier EA takes out a differential between the divided voltage and reference voltage Vref. The output signal of the error amplifier EA whose noise component is removed by the compensation circuit having the resistance and capacitor provided at the terminal EO is transmitted to the voltage comparison circuit VC1. The resistance and capacitor provided at the terminal TRK form a soft start signal to transmit it to the error amplifier EA. The output voltage Vout immediately after power-on is controlled to rise softly corresponding to the soft start signal. Frequency setting of the oscillation circuit OSC is performed by the capacitor connected to the terminal CT shown in FIG. 18 and the constant currents I1 and I2 to set the frequency of the PWM signal. The pulse formed by the oscillation circuit OSC is supplied to the pulse generation circuit PG to form the reset signal RES of the flip-flop circuit FF and the maximum duty signal MXD as a forceful set signal.

In the peak current control system, the reset signal RES formed by the oscillation circuit OSC resets the flip-flop circuit FF to start the PWM signal obtained from the invert output /Q. This turns on the high potential side switch MOSFETQ10. The sense current IL/N is detected by the MOSFETQ11 to be a voltage signal. The divided voltage of the output voltage Vout formed by the error amplifier EA is compared with the differential output EO of the reference voltage Vref by the voltage comparison circuit VC1. When the voltage corresponding to the IL/N reaches the voltage EO, the flip-flop circuit FF is set to change the PWM signal to the low level. This turns off the high potential side switch MOSFETQ10 and MOSFETQ11. The low potential side MOSFETQ12 is switched on.

The MOSFETQ14 and the MOSFETQ13 provided on the emitter side of the transistor T1 receive the output signal Q of the flip-flop circuit FF to perform switch operation and is operated to provide hysteresis characteristic to voltage comparison circuit VC1. As described above, when the flip-flop circuit FF is set, the MOSFETQ14 and MOSFETQ15 are turned on to forcefully turn off the transistor T1. The input potential of the voltage comparison circuit VC1 is lowered to maintain the set state until the flip-flop circuit FF is reset by the reset signal RES.

The logic circuit LGC has a circuit setting dead time so that the high potential side MOSFETQ10 and the low potential side MOSFETQ12 are not turned on at the same time, and a level shift circuit converting a control voltage transmitted to the high potential side MOSFETQ10 and MOSFETQ11 to a signal level corresponding to the boosted voltage.

In this embodiment, when the switching power supply devices according to this invention are connected in parallel, the outputs of the error amplifiers EA are connected to be used for high accuracy current share. In the current share, the output of the error amplifier EA is connected to the external terminal ISH via the diode (the base and emitter of the transistor T2). For instance, the external terminals ISH of two switching power supply devices are interconnected. The external terminals ISH are interconnected to share the output voltages of the error amplifiers EA of the two switching power supply devices to operate to form the similar output voltage Vout. Sharing is possible. The output current supply capability can be doubled. As described later, when plural switching power supply devices are operated in parallel, the electric current IL flowed the individual switching power supply devices are equally distributed, which is an important condition to prevent thermal runaway due to the fact that the specified switching power supply device bears a large electric current.

The noise current displaces the ripple current from the steady-state ripple current for oscillation operation. The slope compensation circuit is provided. When a noise current is inputted, the slope waveform is added to focus to the steady-state ripple current waveform. Such slope compensation is described in detail in the Non-Patent Document 1.

In this embodiment, without being particularly limited, the following monitoring circuit is provided. The signal path of the monitoring circuit is omitted. The monitoring circuit has circuit VLCOC monitoring that input voltage VIN is lowered below a predetermined voltage, and circuit OCLC using the feedback signal CS to monitor overcurrent in which an output current is above a predetermined current. These detection signals UVLO and OCL are inputted to the logic circuit LGC to turn off output MOSFETQ10 and MOSFETQ11 irrespective of the PWM signal. The signals UVLO and OCL and the operation control signals ON/OFF of the switching power supply device are supplied to the OR gate circuit G2 and turn on the MOSFETQ15 to bring the terminal TRK to the low level. This stops an output of the error amplifier EA.

Figure 27:
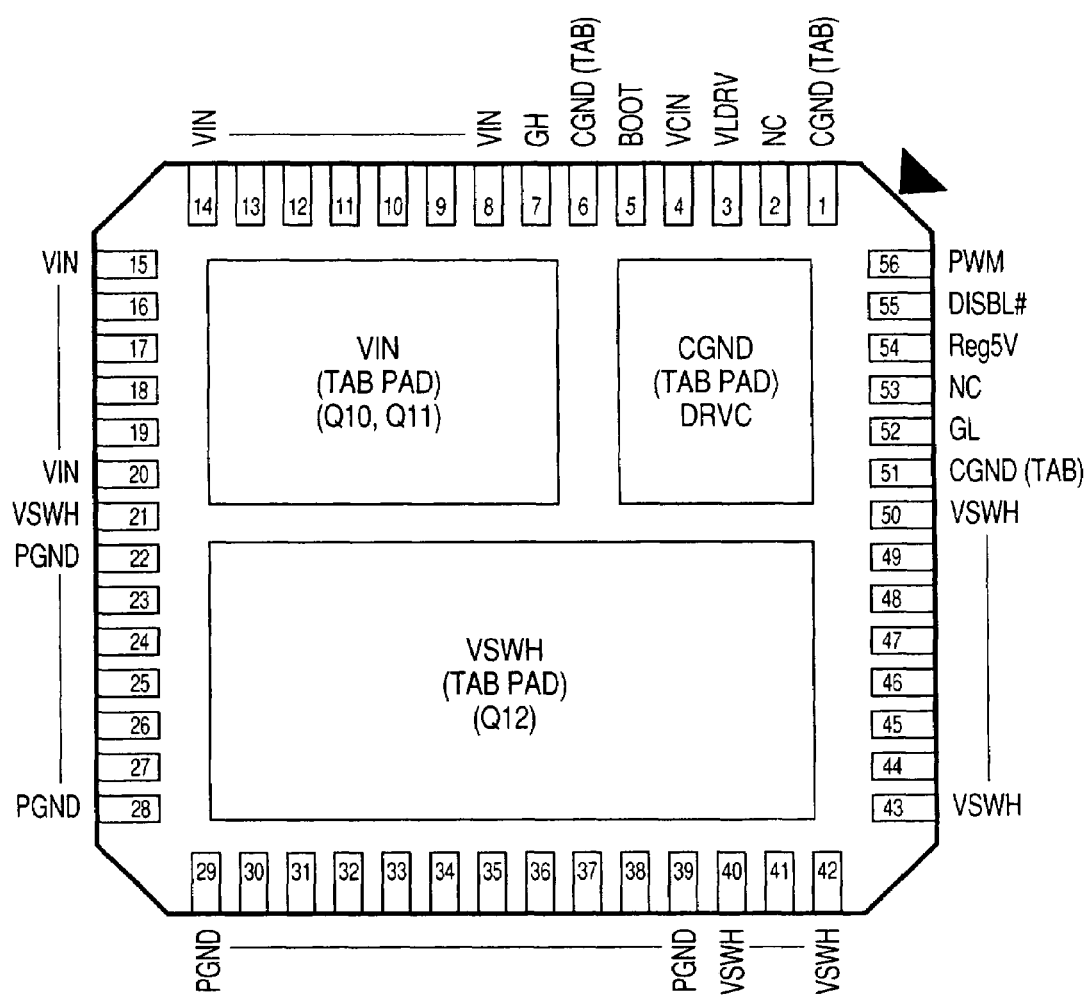
FIG. 27 is a block diagram showing an embodiment of the semiconductor integrated circuit device used for the switching power supply device according to this invention.

FIG. 27 shows a block diagram of an embodiment of the semiconductor integrated circuit device used for the switching power supply device according to this invention. The drawing illustrates the pin arrangement and the inner construction corresponding to an actual semiconductor integrated circuit device. In this embodiment, it is a multi-chip module integrated circuit in which three semiconductor chips are mounted over one package. The semiconductor chip has the high potential side switch MOSFETQ10 and MOSFETQ11 (GH), the low potential side switch MOSFETQ12 (GL), and the control circuit DRVC shown in FIG. 26. As indicated by the dotted line in FIG. 26, like the control circuit DRVC, the semiconductor integrated circuit device is constructed by a semiconductor chip having the drivers DV1 and DV2, the logic circuit LGC, the differential amplification circuit AMP, MOSFETQ13, and power supply circuit REG. When the switching power supply device like FIG. 26 is constructed, the circuit of the control part forming the PWM signal of the control circuit is constructed in the semiconductor integrated circuit device of a different chip externally provided. Four semiconductor chips are constructed as one module.

The semiconductor integrated circuit device of this embodiment is provided with 1 to 56 external terminals around the chip. The signal or voltage as shown in the drawing is supplied to each of them. Alternatively, the external components are connected. The semiconductor integrated circuit device is provided on its back surface side with the input terminal VIN, the output terminal SW, and a tab pad like the CGND. All control circuits of FIG. 26 may be incorporated into the control circuit DRVC to be mounted over one package.

Typically, when the sense MOS system as described above is employed, the sense MOSFETQ11 and the main MOSFETQ10 need be devices of the same construction since a pair ratio thereof is important. The semiconductor integrated circuit device need be a device of one chip construction in which power MOSFETs are incorporated into a control IC. The discrete construction in which the controller and the power MOSFETs are mounted over different chips cannot obtain the sense current. When the power MOSFETs are incorporated into the control IC in one chip construction, the characteristic of the power MOSFETs is deteriorated more significantly than that of discrete power MOSFETs. It cannot be used for large current application to limit a current capacitance.

The vertical type construction MOSFETs like this embodiment are used to dispose, in one semiconductor chip CP1, as shown in FIG. 25, the main MOSFETQ10 on the high potential side and the sense MOSFETQ11 having the same construction as that of the main MOSFETQ10 and being 1/N times the main MOSFETQ10. The pair ratio variation in the threshold voltage Vgs and the ON-state resistance of both the MOSFETQ10 and the MOSFETQ11 caused in the manufacturing process can be minimum. The ON-state resistance with temperature rise is similarly increased or decreased in the main MOSFETQ10 and the sense MOSFETQ11. The sense current has less temperature dependence. A high accuracy differential amplification circuit like FIG. 2 is combined with the MOSFETQ10 and the MOSFETQ11, detecting a high accuracy sense current which can be used in peak current control. The vertical type power MOSFETQ10 to MOSFETQ12 shown in the device construction cross-sectional view of FIG. 9 are used.

Figure 28:
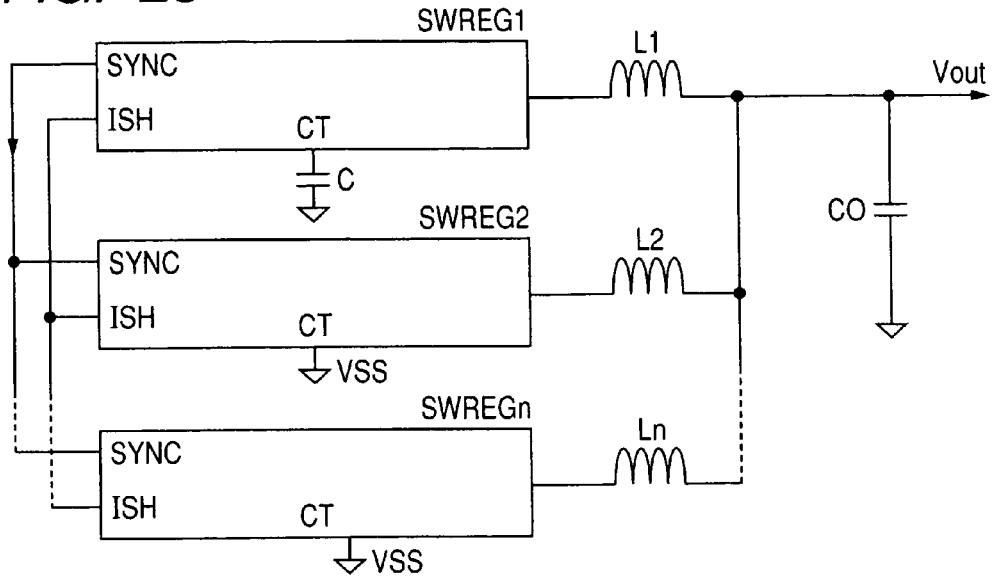
FIG. 28 is a block diagram showing an embodiment of a power supply device according to this invention.

FIG. 28 shows a block diagram of an embodiment of a power supply device according to this invention. In this embodiment, the terminals SYNC and ISH of switching power supply devices SWREG 1 to SWREGn as shown in FIG. 26 are interconnected. The terminal CT of the switching power supply device SWREG 1 is connected to the capacitor C. The operation of the oscillation circuit OSC and the voltage judge circuit VD as shown in FIG. 18 brings the synchronization terminal SYNC into the output mode in the switching power supply device SWREG1 to output a pulse formed by the oscillation circuit OSC of the switching power supply device SWREG1.

The terminals CT of the switching power supply devices SWREG2 to SWREGn are given the circuit ground potentials VSS. The operation of the oscillation circuit OSC and the voltage judge circuit VD as shown in FIG. 18 brings the synchronization terminals SYNC of the switching power supply devices SWREG2 to SWREGn into the input mode. The SWREG2 to SWREGn to which a pulse formed by the oscillation circuit OSC of the switching power supply device SWREG1 is inputted perform synchronization operation with the switching power supply device SWREG1. The terminals ISH shown in FIG. 26 are interconnected. The switching power supply devices SWREG1 to SWREGn are operated to distribute the same current. A load current concentrates on a specific switching power supply device in parallel operation to break the output MOSFET, which can be prevented.

The power supply device of FIG. 28 permits synchronization operation simply by connecting the synchronization terminals SYNC of the switching power supply devices SWREG1 to SWREGn. This can increase the current supply capability ton times. The above-described synchronization operation equalizes noise frequencies generated from the switching power supply devices SWREG1 to SWREGn. Measures to reduce such noise can be performed to a specific frequency.

Figure 29:
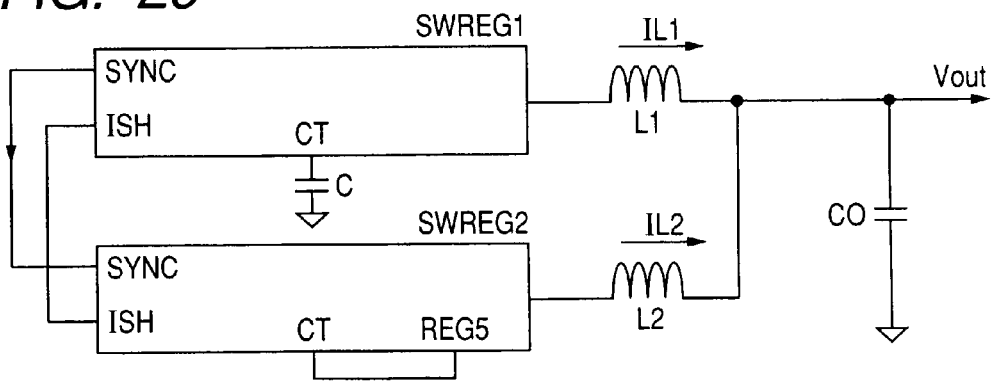
FIG. 29 is a block diagram showing another embodiment of the power supply device according to this invention.

FIG. 29 shows a block diagram of another embodiment of a power supply device according to this invention. In this embodiment, the terminals SYNC and ISH of switching power supply devices SWREG 1 to SWREGn as shown in FIG. 26 are interconnected. The terminal CT of the switching power supply device SWREG 1 is connected to the capacitor C, as described above. The operation of the oscillation circuit OSC and the voltage judge circuit VD as shown in FIG. 18 brings the synchronization terminal SYNC into the output mode in the switching power supply device SWREG1 to output a pulse formed by the oscillation circuit OSC of the switching power supply device SWREG1.

The terminal CT of the switching power supply device SWREG2 is given the supply voltage REG5. The operation of the oscillation circuit OSC and the voltage judge circuit VD as shown in FIG. 18 brings the synchronization terminal SYNC of the switching power supply device SWREG2 into the input mode. The switching power supply device SWREG2 to which a pulse formed by the oscillation circuit OSC of the switching power supply device SWREG1 is inputted. The switching power supply device SWREG2 inverts the pulse to supply it to the pulse generation circuit PG and performs synchronization operation in which the phase is shifted 180° with respect to the switching power supply device SWREG1. The clocks are 180° phase inverted to each other in the switching power supply devices SWREG1 and SWREG2 for performing two-phase operation.

Figure 30:
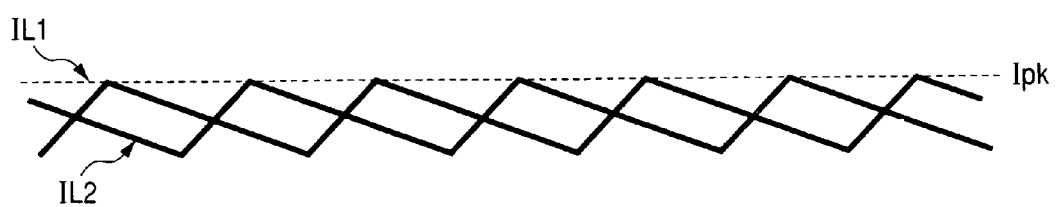
FIG. 30 is an operating waveform diagram of the power supply device of FIG. 29.

As shown in the waveform diagram shown in FIG. 30, such two-phase operation reduces the ripple currents of the load currents IL1 and IL2 flowed to the switching power supply device SWREG1 and the inductors L1 and L2 provided in the SWREG1. The ripple voltage of the output voltage Vout and the ripple current of the output smoothening capacitor CO can be smaller. The operating frequency in appearance of the power supply device is doubled and the response (response to the load current) of the power supply can be increased. The operating frequency in appearance of the power supply device maintains the response. The operating frequencies of the switching power supply devices SWREG1 and SWREG2 can be reduced to half. The switching loss in the individual switching power supply devices SWREG1 and SWREG2 can be reduced to half. The efficiency of the power supply device can be increased. The terminals ISH shown in FIG. 26 are interconnected. The switching power supply devices SWREG1 and SWREG2 are operated so as to distribute the same current. In combination with the embodiment of FIG. 28, plural switching power supply devices may be two-phase operated.

In the power supply devices operated in parallel, the switching power supply devices having a relatively small current supply capability are designed as general-purpose switching power supply devices. The number of parallel operations of the general-purpose switching power supply devices is determined corresponding to the load current of the system over which the switching power supply devices are mounted. This can standardize the switch power supply. Substantial mass production of the power supply devices is possible.

The invention which has been made by the present inventors is specifically described based on the embodiments. The present invention is not limited to the embodiments and various modifications can be made in the scope without departing from its purport. For instance, the power MOSFET may be a lateral type MOSFET. Such lateral MOSFET may be used to mount part of the control circuit over one semiconductor chip. The high potential side switch MOSFETGH may be a P channel MOSFET. In that case, the main MOSFETQM and the sense MOSFETQS are P channel MOSFETs and are constructed as vertical type MOSFETs. The gates and the sources are shared over the same semiconductor substrate.

The MOSFET which has the drain terminals of the main MOSFETQM and the sense MOSFETQS connected to the inputs of the differential amplification circuits AMP, respectively and receives the output voltage Vo of the differential amplification circuit AMP is of P channel type when the high potential side switch MOSFETGH is a P channel MOSFET. When the MOSFET is of N channel type, the output voltage Vo need be driven at a high voltage since the high potential side switch MOSFETGH is connected to the input voltage Vin. The construction of the differential amplification circuit AMP need be complicated. Alternatively, the differential amplification circuit AMP and the MOSFETQ3 need be formed over the semiconductor substrate having the high potential side switch MOSFETGH to increase a breakdown voltage.

In FIG. 18, the terminal CT constructing the oscillation circuit is used to bring the synchronization terminal SYNC into the output mode or the input mode, or the pulse phase in the input mode is brought into the in phase mode or the invert mode. Thus, the switching operation is performed in three ways. With any available space of the external terminals, a control terminal is provided to easily realize the equal function.

A quarter frequency divider circuit is provided in the output part of the oscillation circuit PSC to form four pulses whose phases are shifted 90°. A function so that the pulses are outputted or inputted from/to four synchronization terminals may be added. In this case, one switching power supply is master operated and three switching power supplies are slave operated. Then, pulses whose phases are shifted 90° with each other are inputted from the three synchronization terminals to the master side. The four switching power supplies can be operated in parallel by pulses whose phases are shifted 90° with each other. The operating frequency in appearance can be four times or switching loss can be reduced to one quarter.

The power MOSFET of the switching power supply may be a lateral type MOSFET. Such lateral MOSFET is used so that part of the control circuit may be mounted over one semiconductor chip. The high potential side switch MOSFETQ10 and MOSFETQ11 as the power MOSFETs may be P channel MOSFETs. They may be constructed as vertical type MOSFETs. The gates and the sources are shared over the same semiconductor substrate.

This invention can be widely applied to a voltage drop switching power supply device of an electric current sense system, a semiconductor integrated circuit used therefor, and a power supply device permitting parallel operation.

What is claimed is:

1. A switching power supply device comprising:
   an inductor;
   a capacitor provided between the output side of the inductor and a ground potential;
   a first power MOSFET supplying an electric current from an input voltage to the input side of the inductor; a second power MOSFET turned on when the first power MOSFET is off and allowing the input side of the inductor to be of a predetermined potential; and
   a control circuit which uses a first feedback signal corresponding to an output voltage obtained from the output side of the inductor and a second feedback signal corresponding to an electric current flowed to the first power MOSFET to form a PWM signal and forms a control signal supplied to the gates of the first and second power MOSFETs so that the output voltage is a predetermined voltage,
   wherein the first power MOSFET has plural cells of a vertical type MOS construction, and
   wherein a detection MOSFET having cells of the vertical type MOS construction in which the number of cells is 1/N of that of the first power MOSFET and the gate and the drain or the source are shared with the first power MOSFET over the same semiconductor substrate is provided to form the second feedback signal based on an electric current flowed to the detection MOSFET.

2. The switching power supply device according to claim 1, wherein the gates and the drains of the first power MOSFET and the detection MOSFET are shared over the same semiconductor substrate,
   wherein the control circuit further comprises:
      a differential amplification circuit; and
      a first MOSFET having the source connected to the source of the detection MOSFET and being of a conductive type opposite the detection MOSFET,
   wherein the source of the first power MOSFET and the source of the detection MOSFET are inputted to the differential amplification circuit,
   wherein an output signal of the differential amplification circuit is supplied to the gate of the first MOSFET,
   wherein the source side and the drain side of the first MOSFET are provided with a first and second bias current sources supplying a bias current in addition to a detection current flowed to the detection MOSFET, and
   wherein the drain of the first MOSFET is provided with resistance means converting a sense current to a voltage signal to form the second feedback signal.

3. The switching power supply device according to claim 2, wherein the differential amplification circuit comprises:
   a first and second differential MOSFETs of a first conductive type in which the gates are connected to a first input and a second input, respectively;
   an input side MOSFET and an output side MOSFET of a second conductive type provided in the drains of the first and second differential MOSFETs and constructing a current mirror load circuit;
   a second MOSFET of a first conductive type provided between the sources of the input and output side MOSFETs and a first operating voltage terminal;
   a third MOSFET of a second conductive type in which the gate is connected to the drain of the output side MOSFET connected to the output terminal;
   a fourth MOSFET of a first conductive type in a diode form in which the source is connected to the source of the third MOSFET;
   a first current source provided between the shared source of the first and second differential MOSFETs and a second operating voltage terminal; and
   a second current source flowing a bias current to the third MOSFET and the fourth MOSFET, and
   wherein the second MOSFET and the fourth MOSFET are in a current mirror form.

4. The switching power supply device according to claim 3, wherein the first input receives an output from the source of the first power MOSFET,
   wherein the second input receives an output from the source of the detection MOSFET,
   wherein the second feedback signal is compared with a predetermined voltage and is used for forming an overcurrent detection signal, and
   wherein the overcurrent detection signal turns off the first power MOSFET and the second power MOSFET.

5. The switching power supply device according to claim 4, wherein the first MOSFET has a high voltage construction as compared with a transistor constructing the differential amplification circuit.

6. The switching power supply device according to claim 5, wherein the first power MOSFET and the detection MOSFET are formed over a first semiconductor chip,
   wherein the second power MOSFET is formed over a second semiconductor chip,
   wherein a control part receiving the PWM signal to form a driving signal of the first power MOSFET and the second power MOSFET, and the differential amplification circuit, the first MOSFET, and a control part forming the PWM signal are formed over a third semiconductor chip, and
   wherein the first to third semiconductor chips are mounted over one package.

7. The switching power supply device according to claim 6, wherein the inductor, capacitor, and a resistance device forming a first feedback signal and a second feedback signal are constructed by external components.

8. The switching power supply device according to claim 7, wherein a slope compensation signal is added to the second feedback signal.

9. A semiconductor integrated circuit device comprising:
   a first power MOSFET supplying an electric current from an input voltage to the input side of an inductor;
   a second power MOSFET turned on when the first switch device is off and allowing the input side of the inductor to be of a predetermined potential; and
   a control circuit which receives a PWM signal formed by using a first feedback signal corresponding to an output voltage smoothened by a capacitor provided on the output side of the inductor and a second feedback signal corresponding to an electric current flowed to the first power MOSFET and forms a driving signal supplied to the gates of the first power MOSFET and the second power MOSFET so that the output voltage is a predetermined voltage, wherein the first power MOSFET has plural cells of a vertical type MOS construction, and wherein a detection MOSFET having cells of the vertical type MOS construction in which the number of cells is 1/N of that of the first power MOSFET and the gate and the drain or the source are shared with the first power MOSFET over the same semiconductor substrate is provided to form the second feedback signal based on an electric current flowed to the detection MOSFET.

10. The semiconductor integrated circuit device according to claim 9, wherein the gates and the drains of the first power MOSFET and the detection MOSFET are shared over the same semiconductor substrate, wherein the control circuit further comprises:
a differential amplification circuit; and
a first MOSFET having the source connected to the source of the detection MOSFET and being of a conductive type opposite the detection MOSFET, wherein the source of the first power MOSFET and the source of the detection MOSFET are inputted to the differential amplification circuit, wherein an output signal of the differential amplification circuit is supplied to the gate of the first MOSFET, and wherein the source side and the drain side of the first MOSFET are provided with a first and second bias current sources supplying a bias current in addition to a detection current flowed to the detection MOSFET.

11. The semiconductor integrated circuit device according to claim 10, wherein the differential amplification circuit comprises:
a first and second differential MOSFETs of a first conductive type in which the gates are connected to a first input and a second input;
an input side MOSFET and an output side MOSFET of a second conductive type provided in the drains of the first and second differential MOSFETs and constructing a current mirror load circuit;
a second MOSFET of a first conductive type provided between the sources of the input side and output side MOSFETs and a first operating voltage terminal;
a third MOSFET of a second conductive type in which the gate is connected to the drain of the output side MOSFET connected to the output terminal;
a fourth MOSFET of a first conductive type in a diode form in which the source is connected to the source of the third MOSFET;
a first current source provided between the shared source of the first and second differential MOSFETs and a second operating voltage terminal; and
a second current source flowing a bias current to the third MOSFET and the fourth MOSFET, and
wherein the second MOSFET and the fourth MOSFET are in a current mirror form.

12. The semiconductor integrated circuit device according to claim 11, wherein the first input receives an output from the source of the first power MOSFET, wherein the second input receives an output from the source of the detection MOSFET, wherein the second feedback signal is compared with a predetermined voltage and is used for forming an overcurrent detection signal, and wherein the overcurrent detection signal turns off the first power MOSFET and the second power MOSFET.

13. The semiconductor integrated circuit device according to claim 12, wherein the first power MOSFET and the detection MOSFET are formed over a first semiconductor chip, wherein the second power MOSFET is formed over a second semiconductor chip, wherein the control circuit is formed over a third semiconductor chip, and wherein the first to third semiconductor chips are mounted over one package.

* * * * *